(12) United States Patent
Dutta et al.

(10) Patent No.: US 8,310,870 B2
(45) Date of Patent: Nov. 13, 2012

(54) NATURAL THRESHOLD VOLTAGE DISTRIBUTION COMPACTION IN NON-VOLATILE MEMORY

(75) Inventors: Deepanshu Dutta, Santa Clara, CA (US); Jeffrey W. Lutze, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 240 days.

(21) Appl. No.: 12/849,510

(22) Filed: Aug. 3, 2010

(65) Prior Publication Data

US 2012/0033500 A1 Feb. 9, 2012

(51) Int. Cl.
*G11C 11/34* (2006.01)
(52) U.S. Cl. ......... 365/185.03; 365/185.17; 365/185.18; 365/185.21; 365/185.22; 365/185.24; 365/185.33
(58) Field of Classification Search ............. 365/185.03, 365/185.17, 185.18, 185.19, 185.21, 185.22, 365/185.24, 185.33
See application file for complete search history.

(56) References Cited

U.S. PATENT DOCUMENTS

| | | | |
|---|---|---|---|
| 6,870,768 B2 | 3/2005 | Cernea et al. | |
| 7,016,226 B2 | 3/2006 | Shibata et al. | |
| 7,158,421 B2 | 1/2007 | Li et al. | |
| 7,177,199 B2 | 2/2007 | Chen et al. | |
| 7,243,275 B2 | 7/2007 | Gongwer et al. | |
| 7,596,031 B2 * | 9/2009 | Hemink et al. | .......... 365/185.03 |
| 7,616,495 B2 | 11/2009 | Mokhlesi | |
| 7,616,500 B2 | 11/2009 | Mokhlesi | |
| 7,630,246 B2 | 12/2009 | Roohparvar | |
| 7,800,956 B2 * | 9/2010 | Lee et al. | ................. 365/185.22 |
| 8,036,041 B2 * | 10/2011 | Li | ............. 365/185.03 |
| 8,064,252 B2 * | 11/2011 | Yip | .......... 365/185.03 |
| 8,144,512 B2 * | 3/2012 | Huang et al. | ............. 365/185.03 |
| 8,174,895 B2 * | 5/2012 | Chen et al. | ............... 365/185.03 |

(Continued)

FOREIGN PATENT DOCUMENTS

| | | | |
|---|---|---|---|
| WO | WO2007047283 A1 | 4/2007 | |
| WO | WO2010/044993 A1 | 4/2010 | |

OTHER PUBLICATIONS

Invitation to Pay Additional Fees and Communication Relating to the Results of the Partial International Search dated Nov. 21, 2011.

(Continued)

*Primary Examiner* — Trong Phan
(74) *Attorney, Agent, or Firm* — Vierra Magen Marcus & DeNiro LLP

(57) ABSTRACT

In a non-volatile memory system, a programming speed-based slow down measure such as a raised bit line is applied to the faster-programming storage elements. A multi-phase programming operation which uses a back-and-forth word line order is performed in which programming speed data is stored in latches in one programming phase and read from the latches for use in a subsequent programming phase of a given word line. The faster and slower-programming storage elements can be distinguished by detecting when a number of storage elements reach a specified verify level, counting an additional number of program pulses which is set based on a natural threshold voltage distribution of the storage elements, and subsequently performing a read operation that separates the faster and slower programming storage elements. A drain-side select gate voltage can be adjusted in different programming phases to accommodate different bit line bias levels.

20 Claims, 28 Drawing Sheets

U.S. PATENT DOCUMENTS

| | | |
|---|---|---|
| 8,184,479 B2 * | 5/2012 | Lee et al. ............... 365/185.22 |
| 2005/0083735 A1 | 4/2005 | Chen et al. |
| 2005/0162913 A1 | 7/2005 | Chen |
| 2009/0323429 A1 | 12/2009 | Lee et al. |
| 2010/0097861 A1 | 4/2010 | Dutta et al. |

OTHER PUBLICATIONS

International Search Report & The Written Opinion of the International Searching Authority dated Jan. 20, 2012, International Application No. PCT/US2011/046197.

* cited by examiner

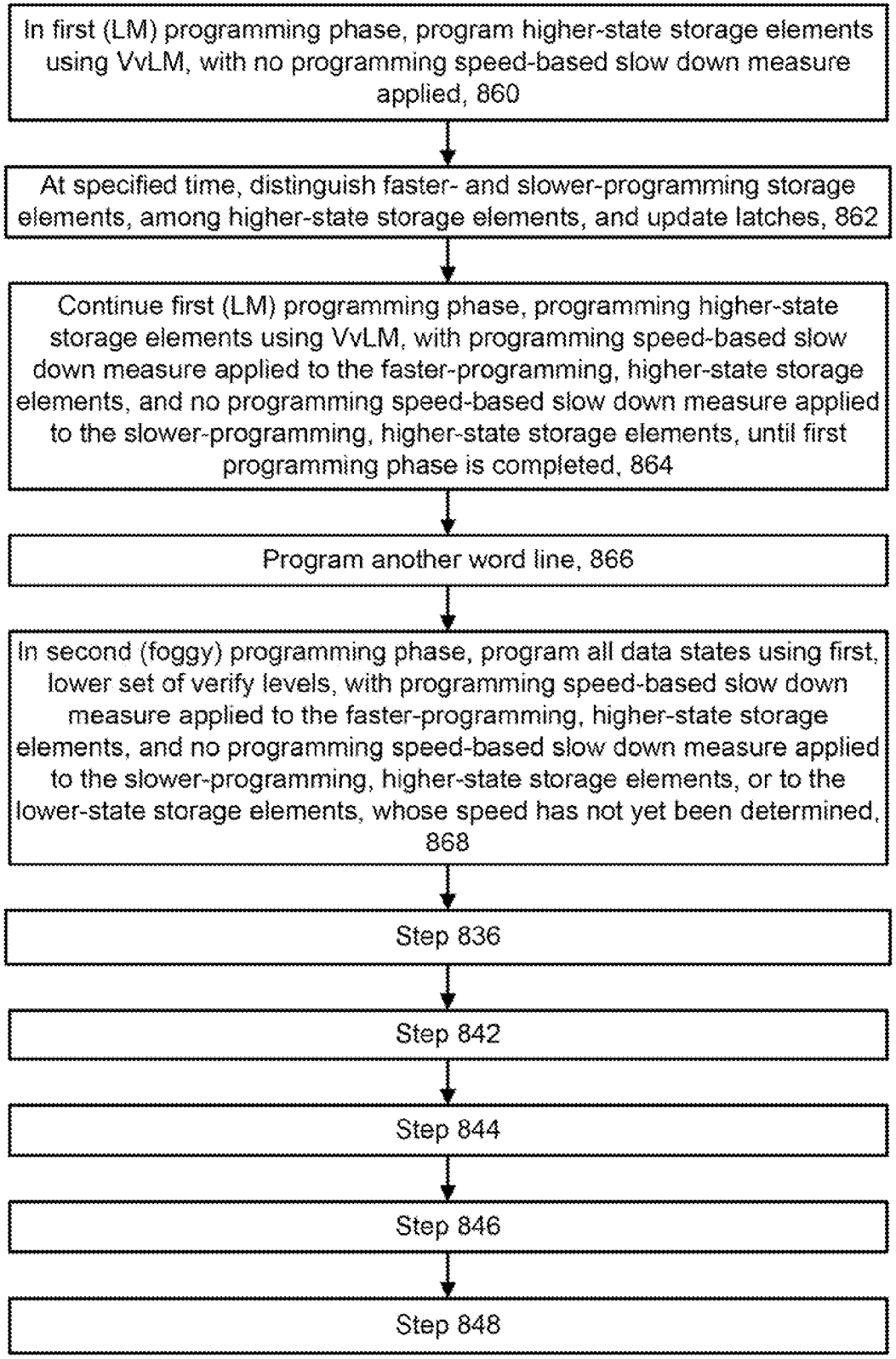

Fig. 9D

| Example | Programming pass | Programming speed obtained for: |
|---|---|---|
| 1 (2-bit) | 1 | all states |
|  | 2 |  |
|  |  |  |
| 2 (2-bit) | 1 | higher states |
|  | 2 |  |
|  | 3 |  |
|  |  |  |
| 3 (2-bit) | 1 | higher states |
|  | 2 | lower states |
|  | 3 |  |
|  |  |  |
| 4 (2-bit) | 1 |  |
|  | 2 | lower then higher states |
|  | 3 |  |
|  |  |  |
| 5 (3-bit) | 1 | higher states |
|  | 2 | lower states |
|  | 3 |  |
|  |  |  |
| 6 (3-bit) | 1 |  |
|  | 2 | lower then higher states |
|  | 3 |  |

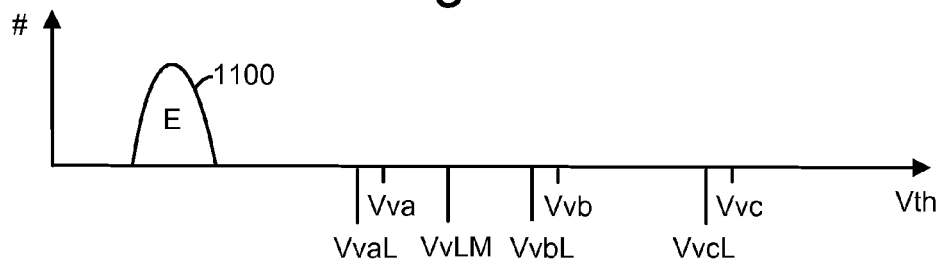
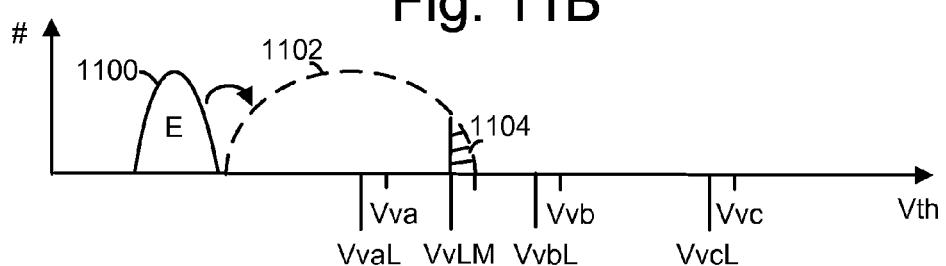
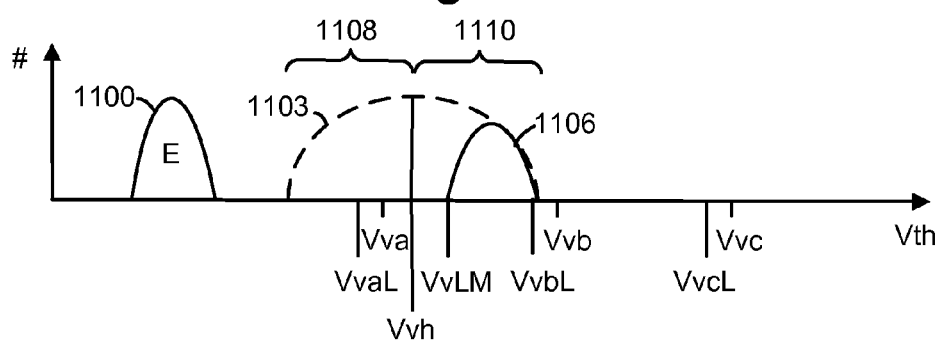

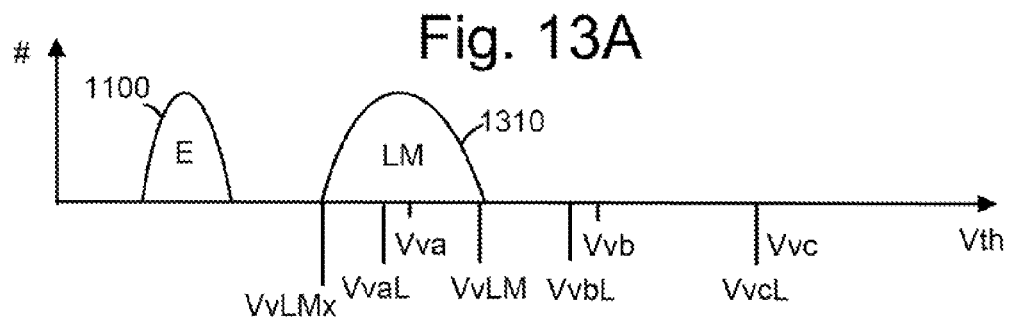
Fig. 13A
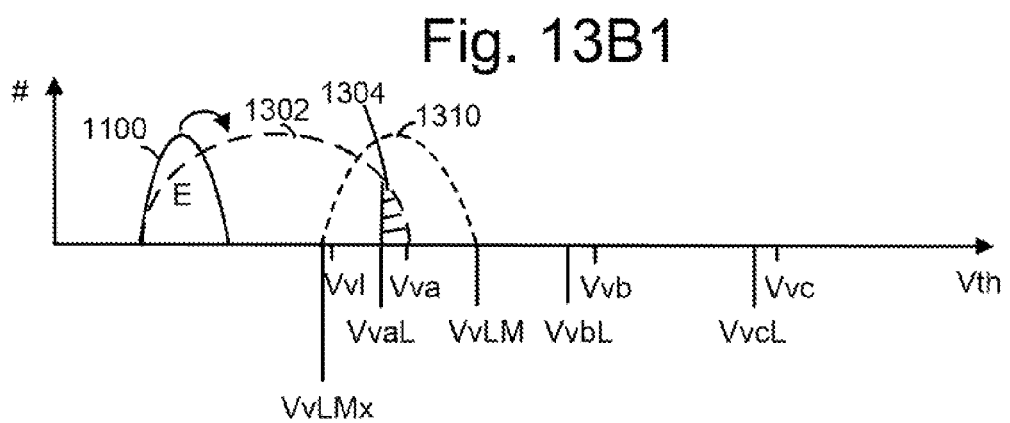
Fig. 13B1
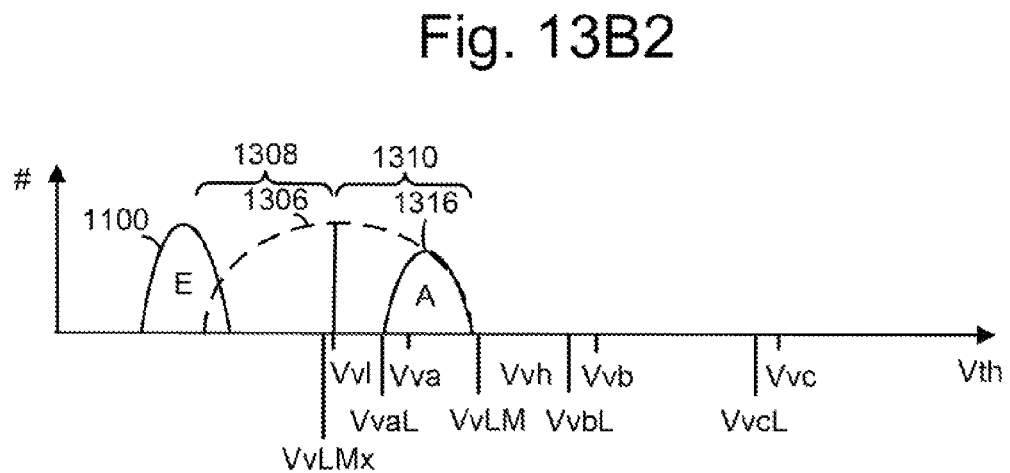
Fig. 13B2

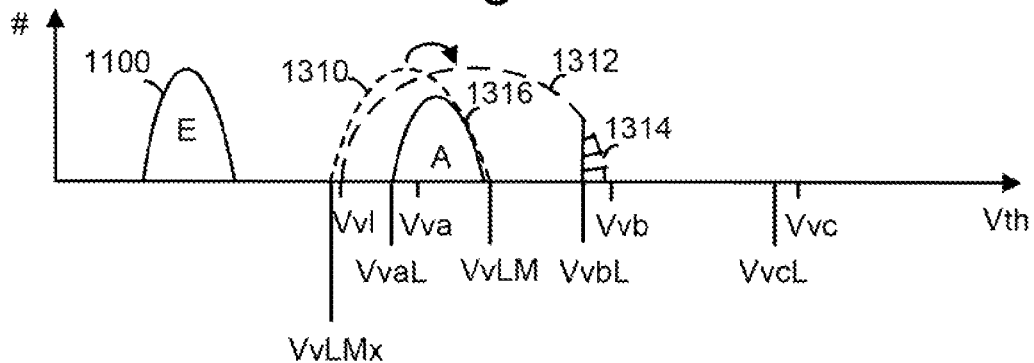
Fig. 13C1
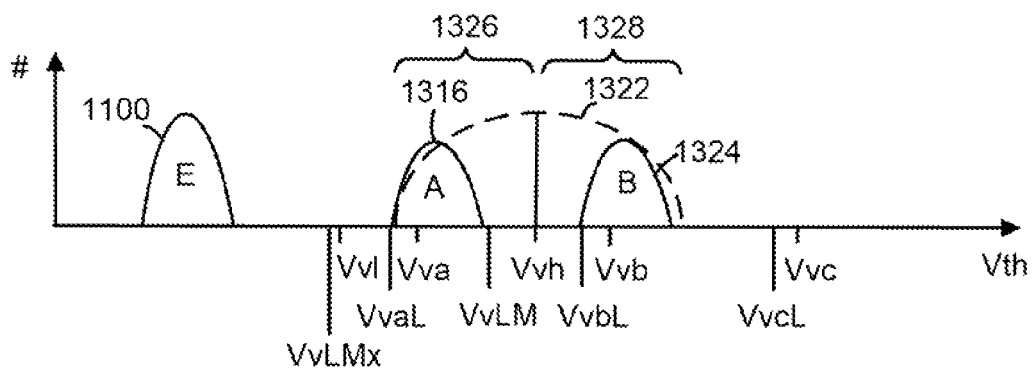
Fig. 13C2
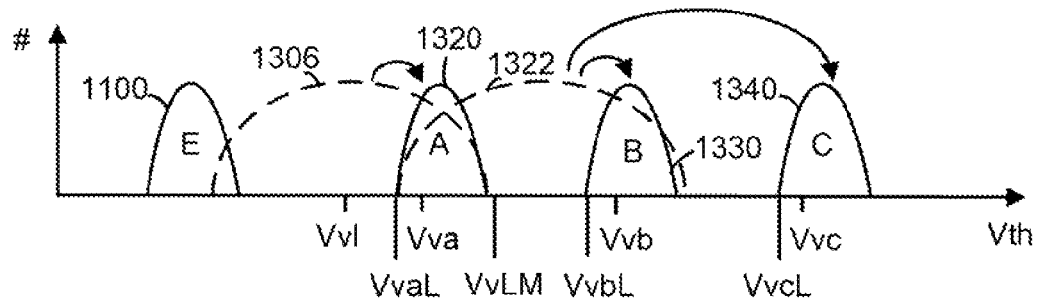
Fig. 13D

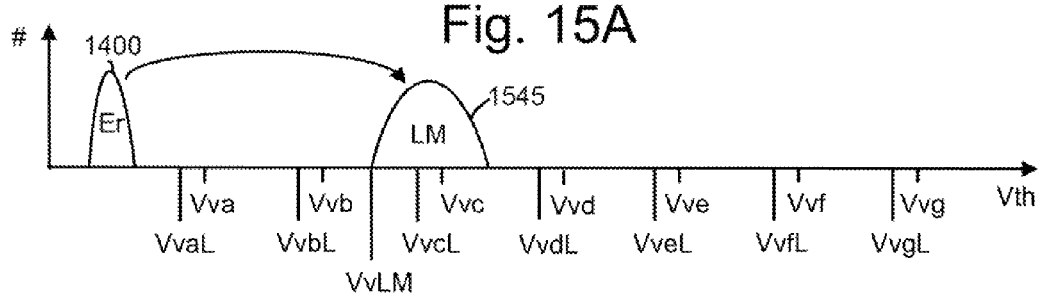
Fig. 15A
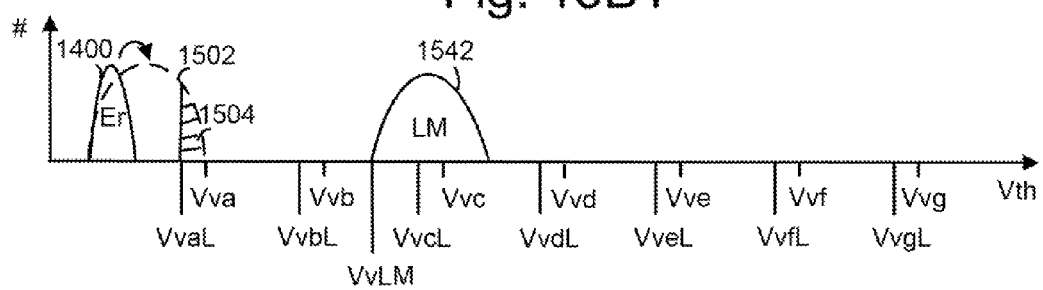
Fig. 15B1
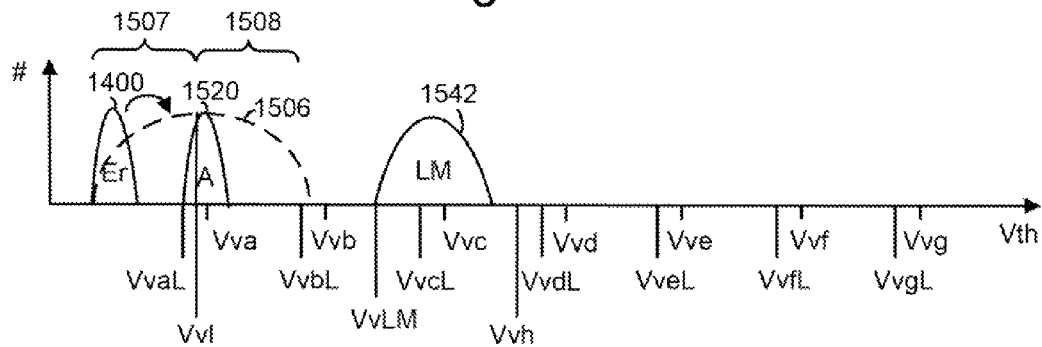
Fig. 15B2

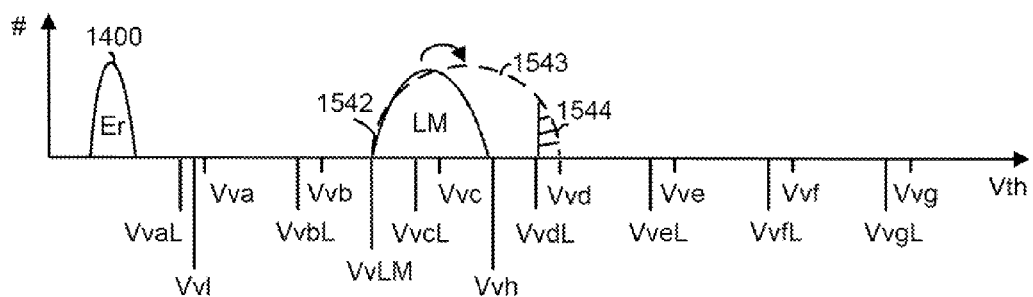
Fig. 15C1
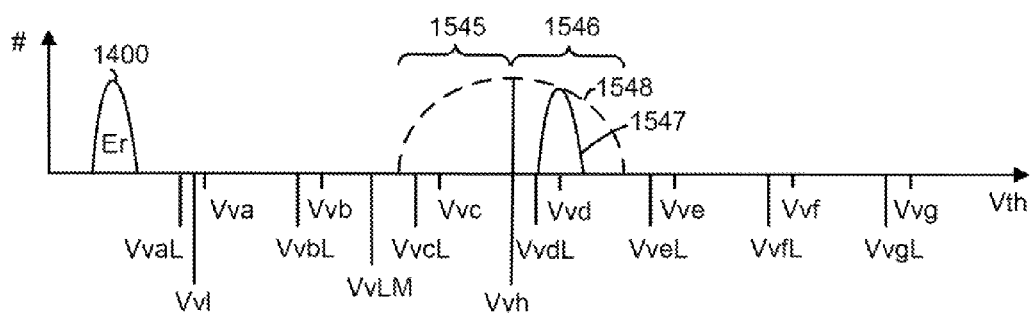
Fig. 15C2

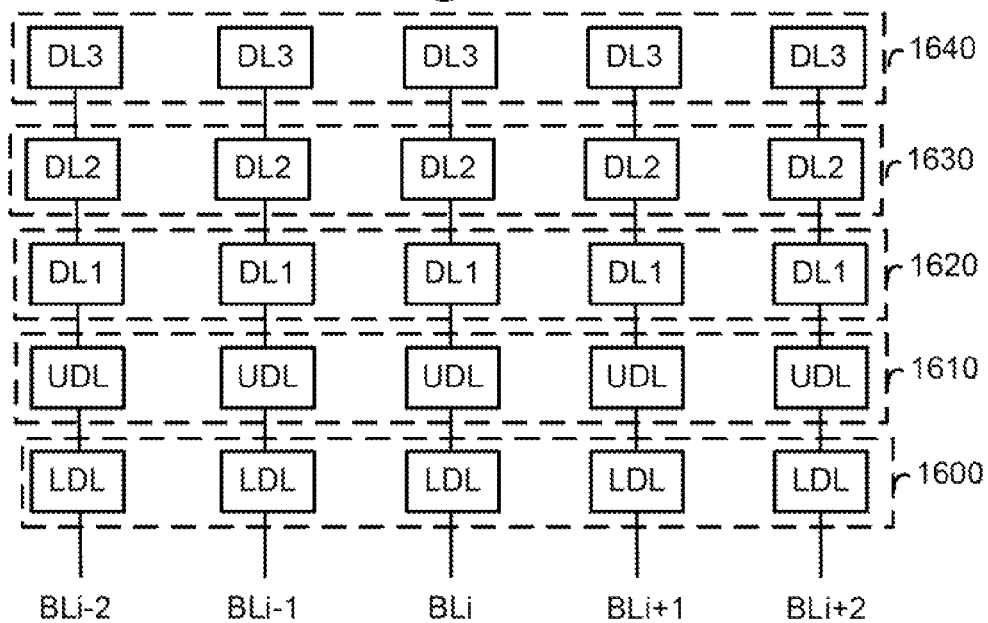
Fig. 16A1
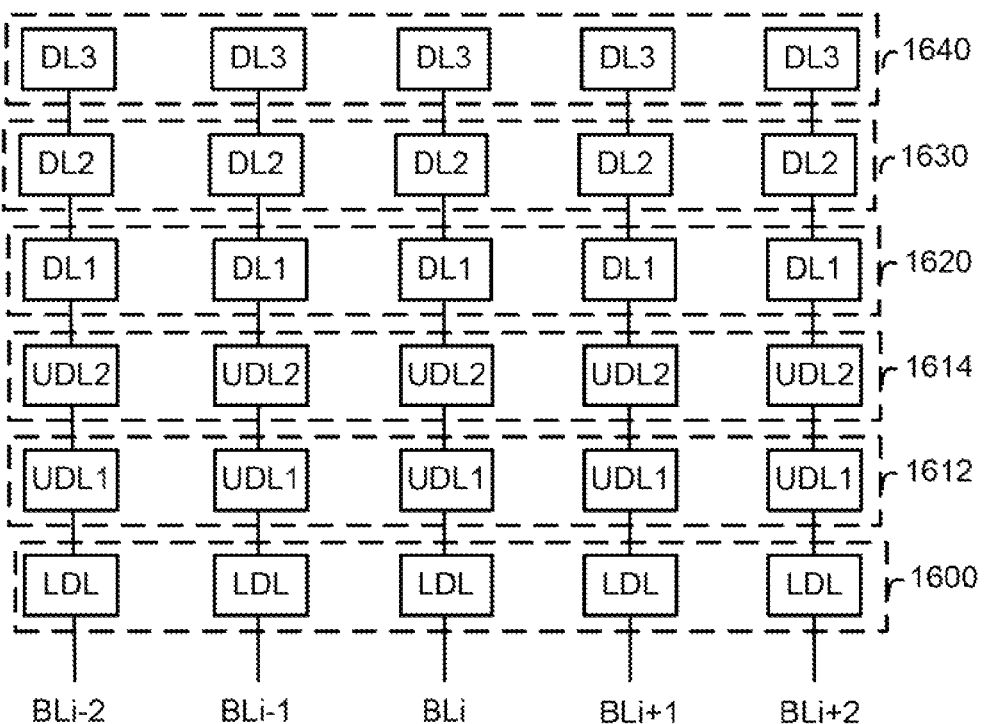
Fig. 16A2

Fig. 16B

Example 1

| Step | DL1 | DL2 |
|---|---|---|
| 1 | WLn all states (w,r) | |
| 2 | WLn all states (m) | WLn+1 all states (w,r) |
| 3 | WLn all states (r,rst) | WLn+1 all states (m) |
| 4 | WLn+2 all states (w,r) | WLn+1 all states (m) |
| 5 | WLn+2 all states (m) | WLn+1 all states (r,rst) |

Fig. 16C1

Example 2

| Step | DL1 | DL2 | DL3 |
|---|---|---|---|
| 1 | WLn high (w,r) | | |
| 2 | WLn high (m) | WLn+1 high (w,r) | |
| 3 | WLn high (r) | WLn+1 high (m) | |
| 4 | WLn high (m) | WLn+1 high (m) | WLn+2 high (w,r) |
| 5 | WLn high (m) | WLn+1 high (r) | WLn+2 high (m) |
| 6 | WLn high (r,rst) | WLn+1 high (m) | WLn+2 high (m) |
| 7 | WLn+3 high (w,r) | WLn+1 high (m) | WLn+2 high (m) |
| 8 | WLn+3 high (m) | WLn+1 high (m) | WLn+2 high (r) |
| 9 | WLn+3 high (m) | WLn+1 high (r,rst) | WLn+2 high (m) |

Fig. 16C2

Example 2

| Step | DL1 | DL2 |
|---|---|---|
| 1 | WLn high (w,r) | |
| 2 | WLn high (m) | WLn+1 high (w,r) |
| 3 | WLn high (r,rst) | WLn+1 high (m) |
| 4 | WLn+2 high (w,r) | WLn+1 high (m) |
| 5 | WLn+2 high (m) | WLn+1 high (r,rst) |
| 6 | WLn+2 high (m) | x |
| 7 | WLn+2 high (m) | WLn+3 high (w,r) |
| 8 | WLn+2 high (r,rst) | WLn+3 high (m) |
| 9 | x | WLn+3 high (m) |

Fig. 16C3

Example 2A

| Step | DL1 | DL2 |
|---|---|---|
| 1 | WLn high (w,r) | |
| 2 | WLn high (m) | WLn+1 high (w,r) |
| 3 | WLn high (r,rst) | WLn+1 high (m) |
| 4 | WLn+2 high (w,r) | WLn+1 high (m) |
| 5 | WLn+2 high (m) | WLn+1 high (r,rst) |

Fig. 16D1

| | | Example 3 or 5 | |
|---|---|---|---|
| Step | DL1 | DL2 | DL3 |
| 1 | WLn high (w,r) | x | x |
| 2 | WLn high (m) | WLn+1 high (w,r) | x |
| 3 | WLn high/low (r/w,r) | WLn+1 high (m) | x |
| 4 | WLn high/low (m/m) | WLn+1 high (m) | WLn+2 high (w,r) |
| 5 | WLn high/low (m/m) | WLn+1 high/low (r/w,r) | WLn+2 high (m) |
| 6 | WLn high/low (r,rst/r,rst) | WLn+1 high/low (m/m) | WLn+2 high (m) |
| 7 | WLn+3 high (w,r) | WLn+1 high/low (m/m) | WLn+2 high (m) |
| 8 | WLn+3 high (m) | WLn+1 high/low (m/m) | WLn+2 high/low (r/w,r) |
| 9 | WLn+3 high (m) | WLn+1 high/low (r,rst/r,rst) | WLn+2 high/low (m/m) |

Fig. 16D2

| | | Example 3 or 5 | |
|---|---|---|
| Step | DL1 | DL2 |
| 1 | WLn high (w,r) | |
| 2 | WLn high (m) | WLn+1 high (w,r) |
| 3 | WLn high/low (r,rst/w,r,rst) | WLn+1 high (m) |
| 4 | WLn+2 high (w,r) | WLn+1 high (m) |
| 5 | WLn+2 high (m) | WLn+1 high/low (r,rst/w,r,rst) |
| 6 | WLn+2 high (m) | x |
| 7 | WLn+2 high (m) | WLn+3 high (w,r) |
| 8 | WLn+2 high/low (r,rst/w,r,rst) | WLn+3 high (m) |
| 9 | x | WLn+3 high (m) |

Fig. 16E

| | | Example 4 or 6 | |
|---|---|---|
| Step | DL1 | DL2 |
| 1 | x | x |
| 2 | x | x |
| 3 | WLn low/high (w,r/w,r) | x |
| 4 | WLn low/high (m/m) | x |
| 5 | WLn low/high (m/m) | WLn+1 low/high (w,r/w,r) |
| 6 | WLn low/high (r,rst/r,rst) | WLn+1 low/high (m/m) |
| 7 | x | WLn+1 low/high (m/m) |
| 8 | WLn+2 low/high (w,r/w,r) | WLn+1 low/high (m/m) |
| 9 | WLn+2 low/high (m/m) | WLn+1 low/high (r,rst/r,rst) |

NATURAL THRESHOLD VOLTAGE DISTRIBUTION COMPACTION IN NON-VOLATILE MEMORY

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Of primary importance is the ability to accurately program data into the memory. However, this becomes more difficult as memory size is scaled down.

BRIEF DESCRIPTION OF THE DRAWINGS

FIG. 8E depicts details of steps 800 and 804 in connection with a three-phase programming operation, in which faster- and slower-programming storage elements are distinguished for higher-state storage elements in a first phase of the three-phase programming operation, and in which faster- and slower-programming storage elements are distinguished for lower-state storage elements in a second phase of the three-phase programming operation.

FIG. 9D depicts example programming scenarios.

FIG. 11A depicts a start of a first phase of a three-phase programming operation in which all storage elements are in the erased state, for a four-level memory device.

FIG. 11B depicts a condition which follows FIG. 11A, in which a minimum number of upper-state storage elements have a Vth>VvLM, in the first phase of the three-phase programming operation.

FIG. 11C depicts a condition which follows FIG. 11B, after an additional number of "m" program pulses have been applied, where faster- and slower-programming upper-state storage elements are distinguished using the read level of Vvh, in the first phase of the three-phase programming operation.

FIG. 13A depicts the start of a second alternative second phase of a three-phase programming operation, in which a lower verify level, VvLMx, is used in place of VvLM.

FIG. 13B1 depicts a condition which follows FIG. 13A, in which a minimum number of lower-state storage elements have a Vth>VvAL, in the second alternative second phase of the three-phase programming operation.

FIG. 13B2 depicts a condition which follows FIG. 13B1, after an additional number of "k1" program pulses have been applied, and faster- and slower-programming lower-state storage elements are distinguished using the read level of Vvl, in the second alternative second phase of the three-phase programming operation.

FIG. 13C1 depicts a condition which follows FIG. 13A, in which a minimum number of upper-state storage elements have a Vth>VvbL, in the second alternative second phase of the three-phase programming operation.

FIG. 13C2 depicts a condition which follows FIG. 13C1, after an additional number of "k2" program pulses have been applied, and faster- and slower-programming upper-state storage elements are distinguished using the read level of Vvh, in the second alternative second phase of the three-phase programming operation.

FIG. 13D depicts programming of lower- and upper-state storage elements, following the conditions of FIGS. 13B2 and 13C2, in the second alternative second phase of the three-phase programming operation.

FIG. 15A depicts programming in a first phase of an alternative three-phase programming operation in which all storage elements are in the erased state, for an eight-level memory device.

FIG. 15B1 depicts programming which follows the condition of FIG. 15A, in a second phase of the alternative three-phase programming operation, in which a minimum number of lower-state storage elements have a Vth>VvaL.

FIG. 15B2 depicts a condition which follows the condition of FIG. 15B1, in the second phase of the alternative three-phase programming operation, after an additional number of "k1" program pulses have been applied, in which faster- and slower-programming lower-state storage elements are distinguished using the read level of Vvl.

FIG. 15C1 depicts programming which follows the condition of FIG. 15A, in the second phase of the alternative three-phase programming operation, in which a minimum number of upper-state storage elements have a Vth>VvdL.

FIG. 15C2 depicts a condition which follows the condition of FIG. 15C1, in the second phase of the alternative three-phase programming operation, after an additional number of "k2" program pulses have been applied, in which faster- and slower-programming upper-state storage elements are distinguished using the read level of Vvh.

FIG. 16A1 depicts data latches for respective bit lines for use in a multi-phase programming operation, for two-bit storage elements.

FIG. 16A2 depicts data latches for respective bit lines for use in a multi-phase programming operation, for three-bit storage elements.

FIG. 16B depicts data stored in data latches for Example 1.

FIG. 16C1 depicts data stored in data latches for Example 2.

FIG. 16C2 depicts an alternative to FIG. 16C1 in which programming speed data is not applied in the third phase.

FIG. 16C3 depicts data stored in data latches for Example 2A.

FIG. 16D1 depicts data stored in data latches for Example 3 or 5.

FIG. 16D2 depicts an alternative to FIG. 16D1 in which programming speed data is not applied in the third phase.

FIG. 16E depicts data stored in data latches for Example 4 or 6.

DETAILED DESCRIPTION

A method and non-volatile storage system for programming a set of non-volatile storage elements by distinguishing faster- and slower-programming storage elements.

Due to scaling of memory devices, more storage element-to-storage element variations along a word line may be experienced, so that the natural threshold voltage (Vth) distribution of a set of storage elements increases. When the natural Vth distribution becomes wider, the number of verify operations which are required for each data state also increases, degrading programming performance by increasing the overall programming time. To overcome this problem, the natural Vth distribution can be decreased in a multi-phase programming operation by detecting faster-programming storage elements and applying a slow down measure, such as a raised bit line voltage, selectively to them in one or more of the programming phases. Various example implementations are provided in two- and three-phase programming operations, although the techniques are generally applicable. Moreover, instead of distinguishing faster- and slower-programming storage elements, e.g., two classes of store elements, it is possible to distinguish more than two classes of storage elements based their programming speeds and apply a slow down measure to the faster classes which is tailored to each class. Moreover, the slow down measure is compatible with an additional bit line increase which is applied in some programming techniques, in which case the bit line voltages can be additive. A drain side select gate voltage can be increased during programming in a selected programming phase to accommodate a larger bit line voltage.

Figure 1:
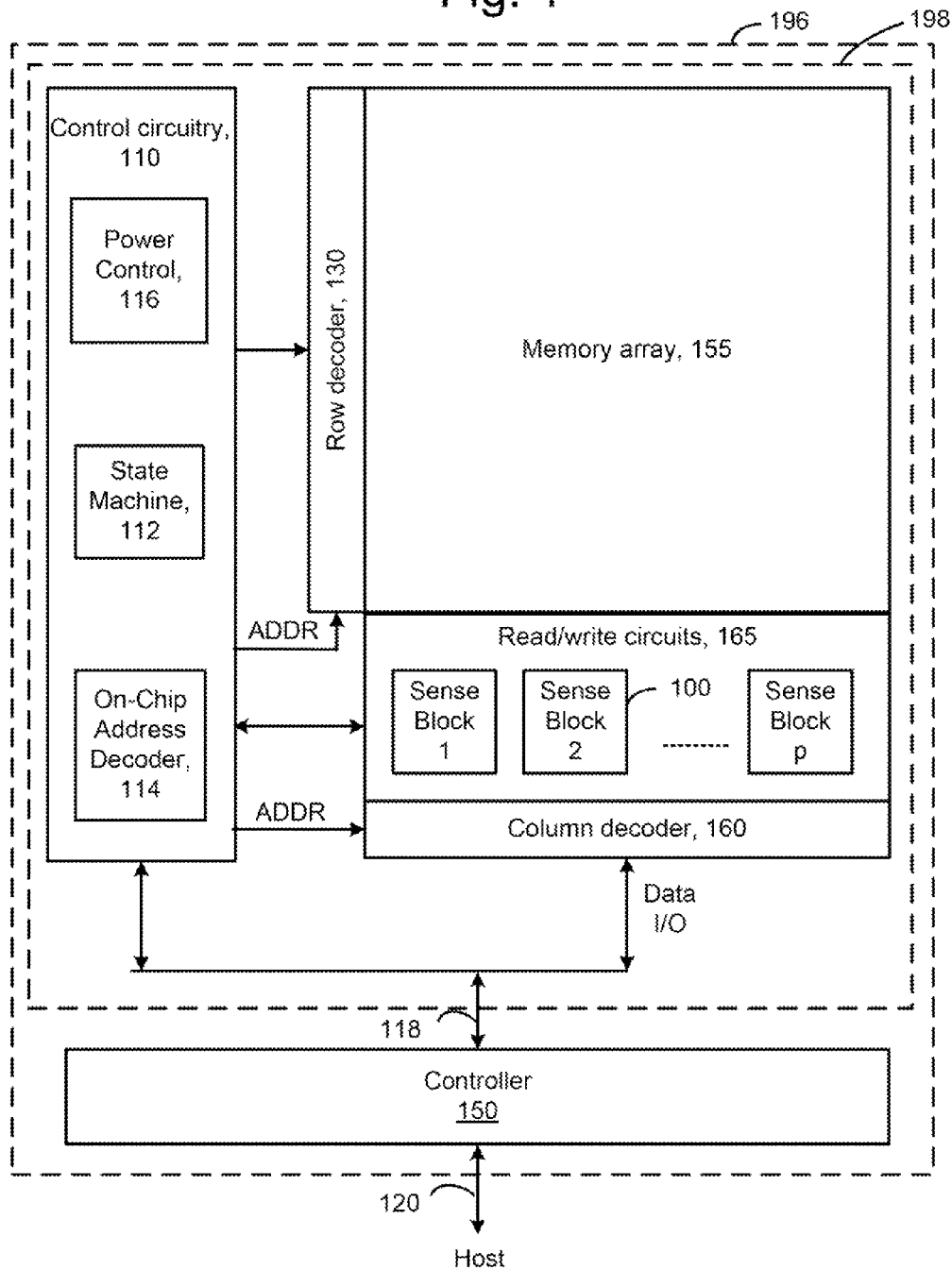
FIG. 1 is a block diagram of a non-volatile memory system using single row/column decoders and read/write circuits.

An example memory system which can be used is discussed next. Generally, any type of non-volatile memory can be used. A memory with NAND strings is an example only. FIG. 1 is a block diagram of a non-volatile memory system using single row/column decoders and read/write circuits. The diagram illustrates a memory device 196 having read/write circuits for reading and programming a page of storage elements in parallel, according to one embodiment. Memory device 196 may include one or more memory die 198. Memory die 198 includes a two-dimensional memory array of storage elements 155, control circuitry 110, and read/write circuits 165. The memory array 155 is discussed further in connection with FIG. 4.

In some embodiments, the array of storage elements can be three dimensional. The memory array 155 is addressable by word lines via a row decoder 130 and by bit lines via a column decoder 160. The read/write circuits 165 include multiple sense blocks 100 and allow a page of storage elements to be read or programmed in parallel. Typically a controller 150 is included in the same memory device 196 (e.g., a removable storage card) as the one or more memory die 198. Commands and data (Data I/O) are transferred between the host and controller 150 via lines 120 and between the controller and the one or more memory die 198 via lines 118.

The control circuitry 110 cooperates with the read/write circuits 165 to perform memory operations on the memory array 155, and includes a state machine 112, an on-chip address decoder 114, and a power control module 116. The state machine 112 provides chip-level control of memory operations. The on-chip address decoder 114 provides an address (ADDR) interface between that used by the host or a memory controller to the hardware address used by the decoders 130 and 160. The power control module 116 controls the power and voltages supplied to the word lines and bit lines during memory operations.

In some implementations, some of the components of FIG. 1 can be combined. In various designs, one or more of the components (alone or in combination), other than memory array 155, can be thought of as a managing or control circuit. For example, one or more control circuits may include any one of, or a combination of, control circuitry 110, state machine 112, decoders 114/160, power control 116, sense blocks 100 (including the processor 192 in FIG. 3), read/write circuits 165, and controller 150, etc. The sense block 100 is discussed further in connection with FIG. 3.

In another embodiment, a non-volatile memory system uses dual row/column decoders and read/write circuits. Access to the memory array 155 by the various peripheral circuits is implemented in a symmetric fashion, on opposite sides of the array, so that the densities of access lines and circuitry on each side are reduced by half Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half.

Figure 2:
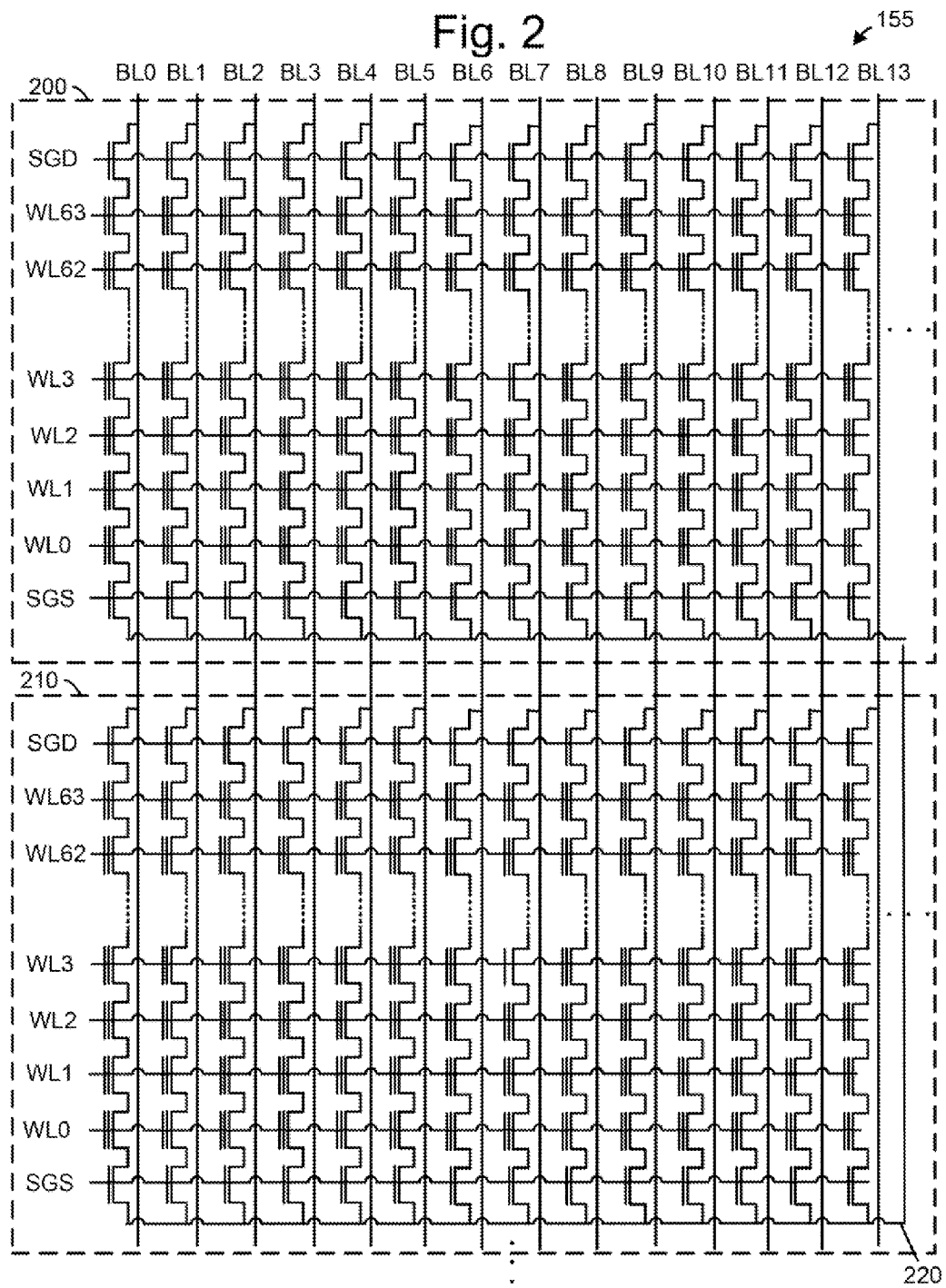
FIG. 2 depicts blocks of NAND flash memory cells in the memory array 155 of FIG. 1.

FIG. 2 depicts blocks of NAND flash memory cells in the memory array 155 of FIG. 1. The memory array can include many blocks. Each example block 200, 210 includes a number of NAND strings and respective bit lines, e.g., BL0, BL1, ... which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixty-four word lines, for example, WL0-WL63, extend between the source select gates and the drain select gates. In some cases, dummy word lines can also be used in the memory array. These word lines contain no user data. For example, a dummy word line can be in between the SGS and WL0, and in between SGD and WL63. Such dummy word lines can shield the edge data word line from certain edge effects (such as certain program disturb mechanisms or endurance degradation) which can be experienced by WL0 and WL63 in this particular example.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3:
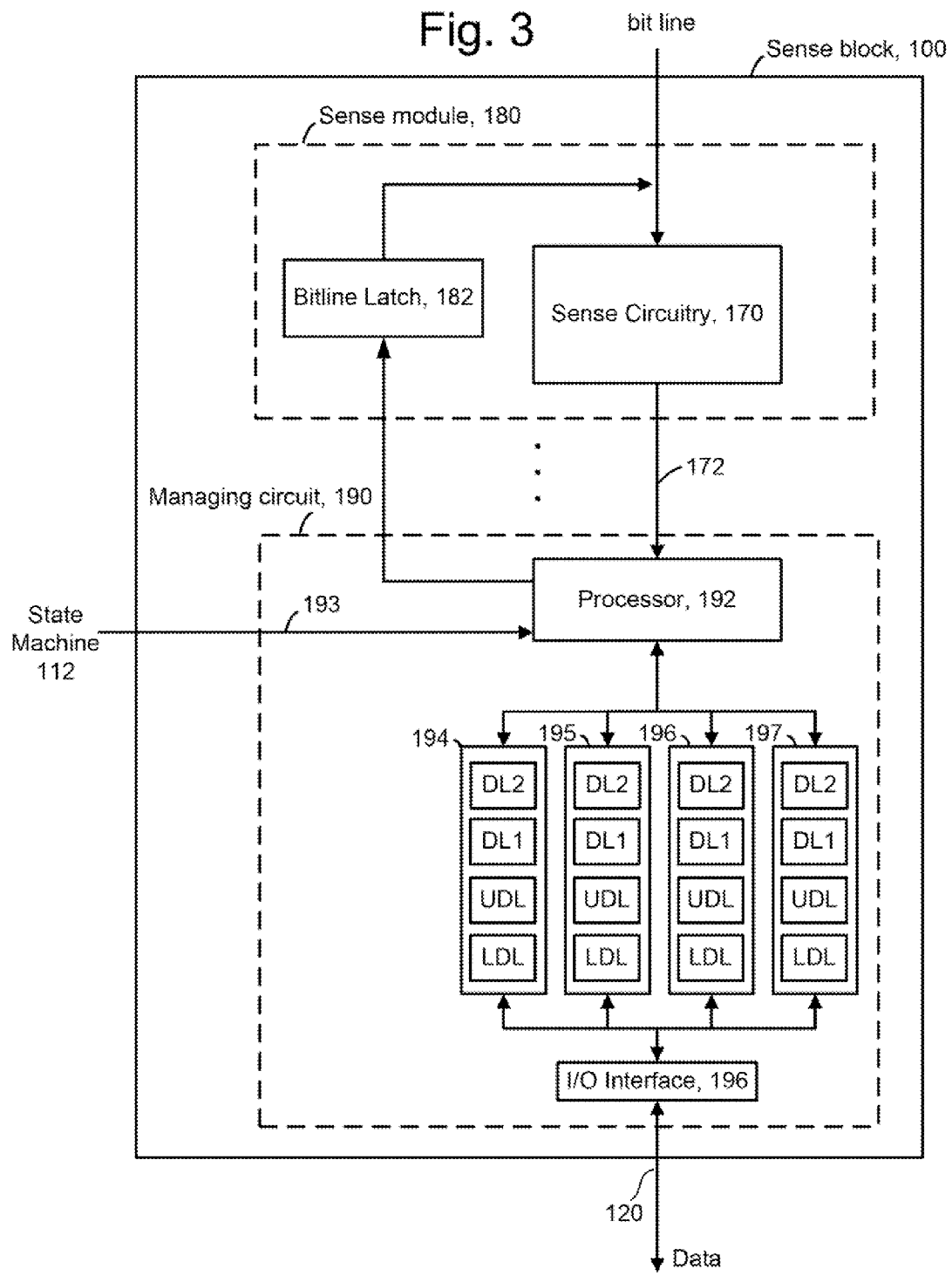
FIG. 3 is a block diagram depicting one embodiment of the sense block 100 of FIG. 1.

FIG. 3 is a block diagram depicting one embodiment of a sense block. An individual sense block 100 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that performs sensing by determining whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 does not inhibit programming.

Managing circuit 190 comprises a processor 192, four example sets of data latches 194-197 and an I/O Interface 196 coupled between the set of data latches 194 and data bus 120. One set of data latches can be provide for each sense module, and data latches identified by LDL, UDL, DL1 and DL2 may be provided for each set. In some cases, additional data latches may be used. See also FIGS. 16A1 and 16A2. LDL stores a bit for a lower page of data, and UDL stores a bit for an upper page of data. This is in a four-level or two-bits per storage element memory device. One additional data latch per bit line can be provided for each additional data bit per storage element. DL1 and DL2 are used to store a bit which indicates whether the associated storage element is fast- or slow-programming. In some cases, the number of extra data latches is the same as the number of phases in a multi-phase programming operation, while in other cases, the number of extra data latches is less than the number of phases in a multi-phase programming operation. The use of the data latches is discussed further below in particular in connection with FIGS. 16A1-16E.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and a corresponding output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit 190, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LDL and UDL latches, in a two-bit per storage element implementation. In a three-bit per storage element implementation, two upper data latches, UDL1 and UDL2, may be used. The programming operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Each set of data latches 194-197 may be implemented as a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of M storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a programming operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. The UDL latches can be used to store an upper page of data, for instance. A UDL latch is flipped when an upper page bit is stored in an associated storage element. This occurs when an associated storage element completes programming, e.g., when its Vth exceeds a target verify level such as Vva, Vvb or Vvc. When UDL1 and UDL2 are used, UDL1 is flipped when a lower, upper bit is stored in an associated storage element, and UDL2 is flipped when an upper, upper bit is stored in an associated storage element. The lower, upper bit can also be referred to as the middle page bit.

Figure 4:
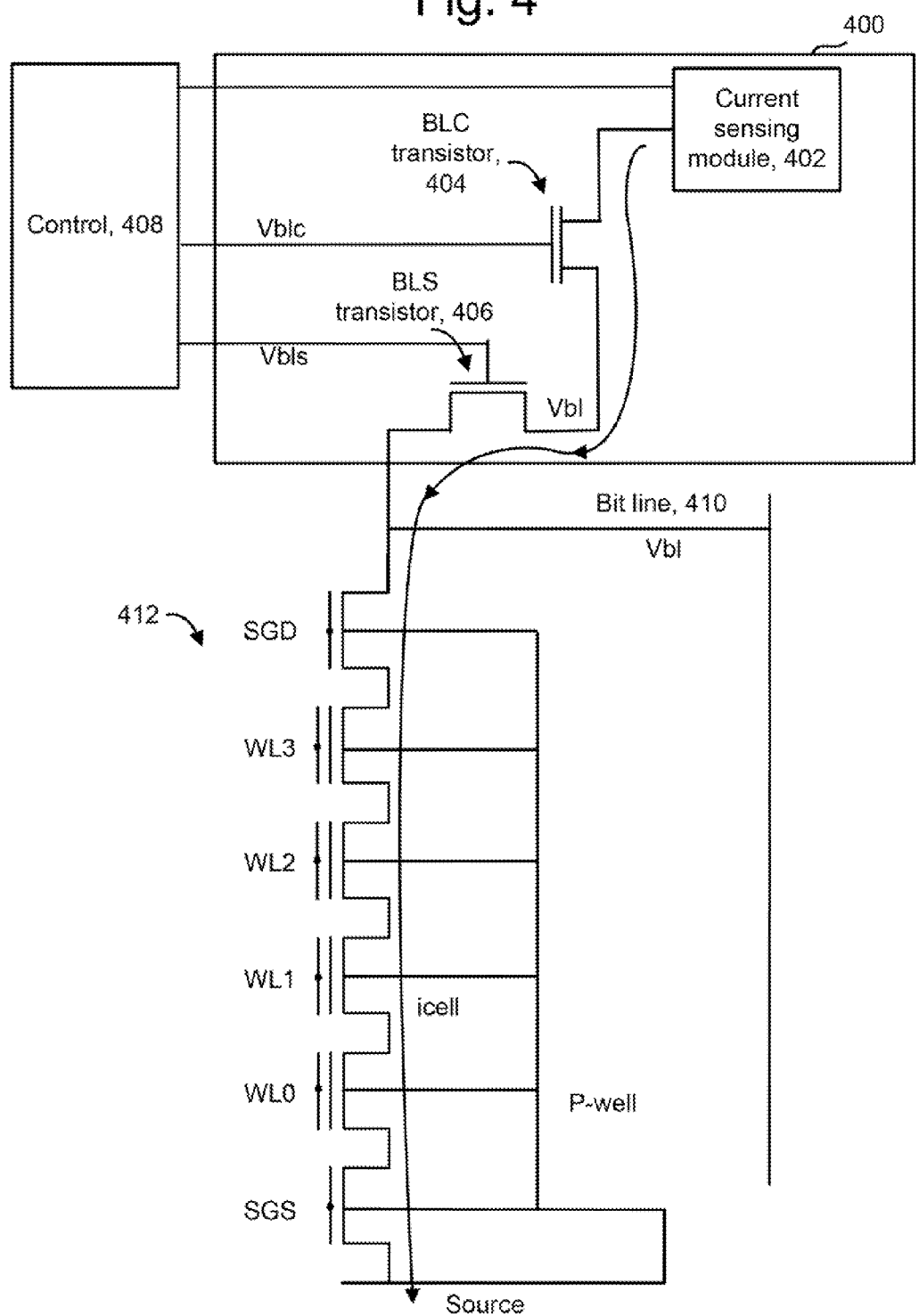
FIG. 4 depicts a configuration of a NAND string and components for sensing.

FIG. 4 depicts a configuration of a NAND string and components for sensing. In one implementation, sense components 400 are provided in the sense block 100 of FIG. 1, and a control 408 is provided by the control circuitry 110 of FIG. 1.

In a simplified example, a NAND string 412 includes four storage elements which are in communication with word lines WL0, WL1, WL2 and WL3, respectively. In practice, additional storage elements and word lines can be used. Further, additional NAND strings are typically arranged adjacent to one another in a block or other set of non-volatile storage elements. The storage elements are coupled to a p-well region of a substrate. A bit line 410 having a voltage Vbl is depicted, in addition to sense components 400. In particular, a BLS (bit line sense) transistor 406 is coupled to the bit line 410. The BLS transistor 406 is a high voltage transistor, and is opened in response to a control 408 during sense operations. A BLC (bit line control) transistor 404 is a low voltage transistor which is opened in response to the control 408 to allow the bit line to communicate with a current sensing module 402. During a sense operation, such as a read or verify operation, a pre-charge operation occurs in which a capacitor in the current sensing module 402 is charged. The BLC transistor 404 may be opened to allow the pre-charging. Also during the sense operation, a verify voltage is applied to a word line of one or more storage elements involved in the operation.

At the drain side of the NAND string 430, the BLS transistor 410 is turned on, e.g., made conductive or opened. Additionally, a voltage Vblc is applied to the BLC transistor 400 to make it conductive. The pre-charged capacitor in the current sensing module 402 discharges through the bit line and into the source so that the source acts as a current sink. The pre-charged capacitor at the drain of the NAND string may be pre-charged to a potential which exceeds a potential of the source so that a current flows through the selected non-volatile storage element and sinks into the source when the selected storage element is in the conductive state.

The pre-charged capacitor does not appreciably discharge when the storage element is in a non-conductive state. After a discharge period, resulting data can be transferred to a managing/control circuit to monitor and control the programming of each storage element.

In particular, if the selected storage element is in a conductive state due to the application of Vcgr, a relatively high current will flow. If the selected storage element is in a non-conductive state, no or relatively little current will flow. The current sensing module 402 can sense the cell/storage element current, icell. In one possible approach, the current sensing module determines a voltage drop which is tied to a fixed current flow by the relationship $\Delta V = i \cdot t / C$, where $\Delta V$ is the voltage drop, i is the fixed current, t is a predetermined discharge time period and C is the capacitance of the pre-charged capacitor in the current sensing module. A greater voltage drop represents a higher current. At the end of a given discharge period, since i and C are fixed, $\Delta V$ for a given current can be determined. In one approach, a PMOS transistor is used to determine a level of $\Delta V$ relative to a demarcation value. In another possible approach, a cell current discriminator serves as a discriminator or comparator of current levels by determining whether the conduction current is higher or lower than a given demarcation current.

Voltage sensing, in contrast, does not involve sensing a voltage drop which is tied to a fixed current. Instead, voltage sensing involves determining whether charge sharing occurs between a capacitor in a voltage sensing module and a capacitance of the bit line. Current is not fixed or constant during the sensing. Little or no charge sharing occurs when the selected storage element is conductive, in which case the voltage of the capacitor in the voltage sensing module does not drop significantly. Charge sharing does occur when the selected storage element is non-conductive, in which case the voltage of the capacitor in the voltage sensing module does drop significantly.

The current sensing module 402 thus can determine whether the selected storage element is in a conductive or non-conductive state by the level of current. Generally, a higher current will flow when the selected storage element is in a conductive state and a lower current will flow when the selected storage element is in a non-conductive state. A threshold voltage of the selected storage element is above or below a compare level, such as a verify level or a read level, when it is in a non-conductive state or a conductive state, respectively.

Figure 5:
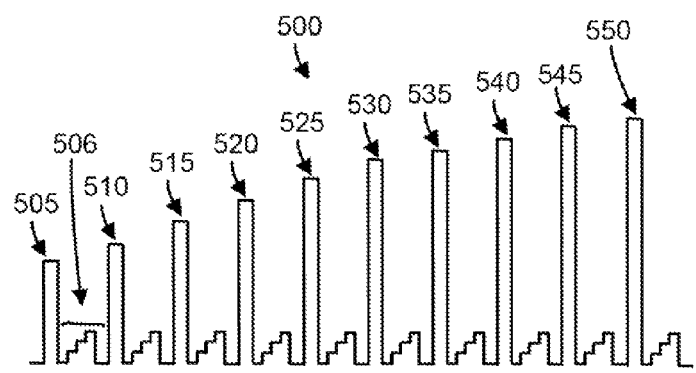
FIG. 5 depicts program pulses applied to a selected word line in a programming operation.

FIG. 5 depicts program pulses applied to a selected word line in a programming operation. Generally, a programming operation can involve applying a pulse train to a selected word line in one or more programming phases, where the pulse train includes program pulses followed by one or more verify pulses. Each phase uses a separate sequence or staircase of program pulses, starting from an initial level and stepping up to a maximum level if necessary to complete the programming of that phase. The programming of a phase is completed when the storage elements reach specified verify levels for the phase.

Note that a program pulse can have any number of different waveform shapes. A square waveform is depicted, although other shapes are possible such as a multilevel shape or a ramped shape. The pulse train 500 includes a series of program pulses 505, 510, 515, 520, 525, 530, 535, 540, 545, 550, . . . , that are applied to a word line selected for programming. A program-verify iteration involves applying a programming pulse to a selected word line followed by performing one or more verify operations by applying one or more verify pulses to the selected word line.

In one possible approach, the program pulses increase incrementally by a fixed step size in a given programming phase. Other variations are possible. For example, the program pulse can increase incrementally by a step size which is specific to the programming phase. The initial and/or final program pulse level can also be specific to the specific programming phase.

Figure 6:
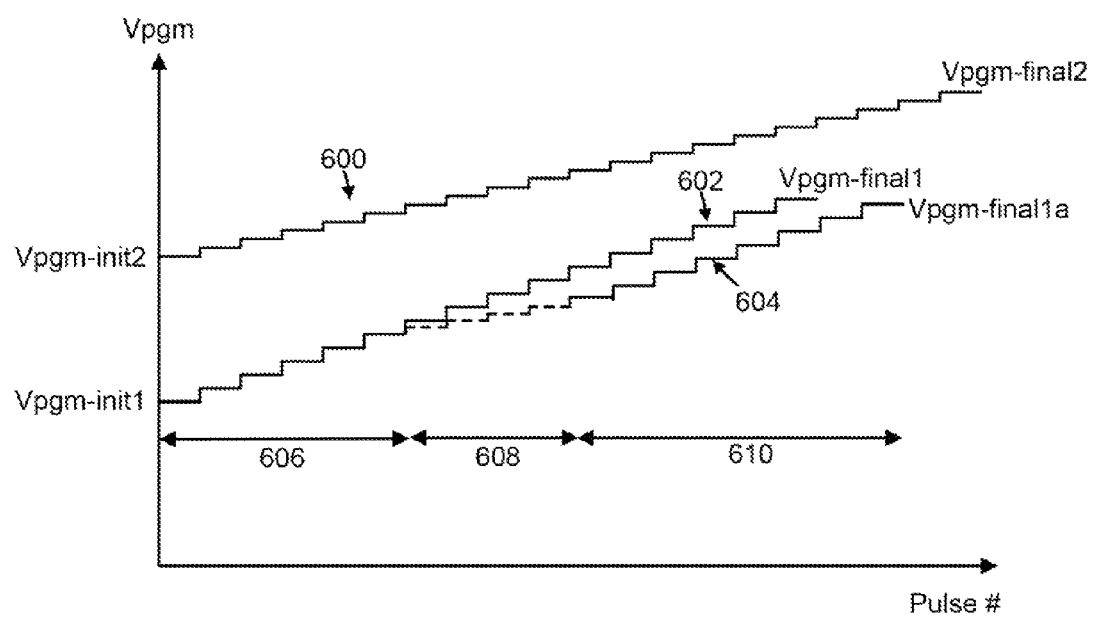
FIG. 6 depicts program voltages which can be applied in different phases of a multi-phase programming operation.

FIG. 6 depicts program voltages which can be applied in different phases of a multi-phase programming operation. The x-axis depicts pulse # and the y-axis depicts Vpgm. For example, waveform 602, starting at Vpgm-init1 and ending at Vpgm-final1, represents a program pulse magnitude for each successive program pulse in a first programming phase. Waveform 600, starting at Vpgm-init2 and ending at Vpgm-final2, uses a smaller step size, and represents a lower program pulse magnitude for each successive program pulse in a second programming phase. The final program pulse level is typically higher for the second phase than for the initial phase. Also, in the second phase, since the Vpgm step size is smaller, more program pulses are needed to finish programming than in the first phase. A further option is to provide a sudden increase in Vpgm for one program pulse by an amount which can be controlled by a ROM fuse parameter of the memory device. This one program pulse with a larger step can be applied when a bit line voltage is raised to slow down faster-programming storage elements. Since at this step, we slow down the faster-programming storage elements by applying a bit line bias, the risk of over-programming is reduced. For subsequent pulses, Vpgm can be stepped up as usual at the fixed step size.

In a three-phase programming operation, in one approach, waveform 602 can be used in the first and second phases and waveform 600 can be used in the last or third phase. It is also possible to use an even larger Vpgm step size in the first phase as compared to the second phase, especially for the case when only the LM-state is programmed in the first phase.

In a further option, waveform 604, which starts at Vpgm-init1 and ends at Vpgm-final1a, can be used in a phase in which programming speed data is obtained. The programming speed data can indicate whether a storage element belongs to the faster or the slower set of storage elements. Waveform 604 includes regions 606 and 610 in which a relatively large step size is used, and region 608 in which a relatively small step size is used. That is, the Vpgm step size is temporarily reduced in the region 608. Thus, when program pulses are applied to a target word line in a multi-phase programming operation, a step size of the program pulses is temporarily reduced when distinguishing faster-programming non-volatile storage elements of the target word line from slower-programming non-volatile storage elements of the target word line.

This approach ensures that a smaller step size is used when the programming speed data is obtained, thereby increasing detection accuracy. Specifically, a start of a region 608 can be set at a time which enables programming speed data to be obtained with greater accuracy. The end of the region 608 can be set at a time which is after the programming speed data has been obtained. The start and/or stop of the region 608 can be set at fixed pulse numbers, for instance. Or, the start and/or stop of the region 608 can be set adaptively. In one possible approach, referring to FIG. 10B discussed further below, the start of region 608 can be set when at least a specified number of storage elements reach the verify level VvaL (such as a few percent of the storage elements). In a non-adaptive approach, the end of region 608 can be set to occur a specified number of program pulses later. Or, in an adaptive approach, the end of region 608 can be set to occur when fewer than a specified number of storage elements (such as a few percent of the storage elements) have not yet reached VvaL, or equivalently, when more than a specified number of storage elements (such as nearly all of the storage elements) have reached VvaL.

Figure 14A:
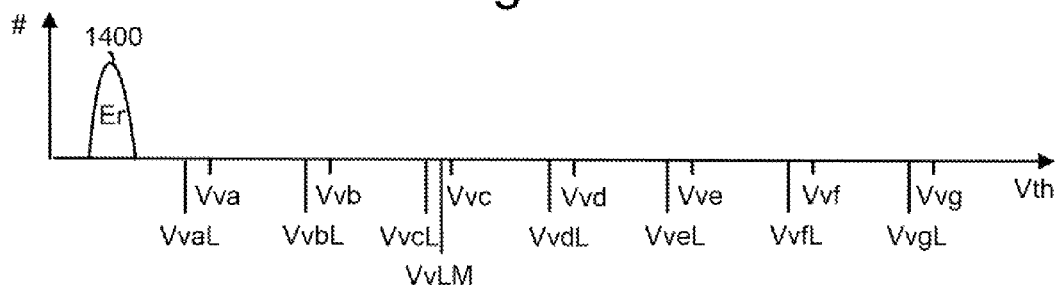
FIG. 14A depicts a start of a first phase of a three-phase programming operation in which all storage elements are in the erased state, for an eight-level memory device.
Figure 14B:
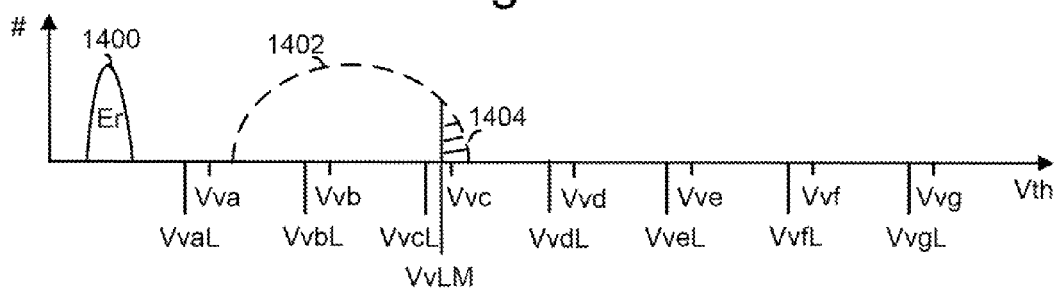
FIG. 14B depicts a condition which follows FIG. 14A, in which a minimum number of upper-state storage elements have a Vth>VvLM, in the first phase of the three-phase programming operation.

A similar approach can be taken with regard to VvaL in the programming of FIGS. 12A, 13B1, 14E and 15B1, VvLM in the programming of FIGS. 11B and 14B, VvbL in the programming of FIG. 13C1 and VvdL in the programming of FIG. 15C1. In some cases, a larger nominal Vpgm step size is used in an LM phase when programming to VvLM, in which case the technique is relatively more useful.

Figure 7A:
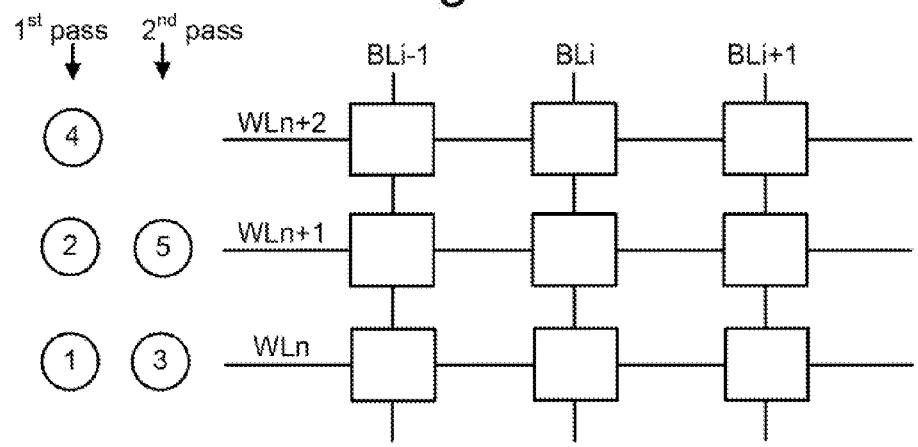
FIG. 7A depicts a two-phase programming operation for a set of storage elements in a back-and-forth word line order.

FIG. 7A depicts a two-phase programming operation for a set of storage elements in a back-and-forth word line order. The components depicted may be a subset of a much larger set of storage elements, word lines and bit lines. In one possible programming operation, storage elements (depicted as squares) on WLn are programmed in a first programming phase ($1^{st}$ pass), as represented by the circled "1." Next ("2"), storage elements on WLn+1 are programmed in a first programming phase for that word line. In this example, when a word line is selected for programming, verify operations occur after each program pulse. During the verify operations on a selected word line, Vread level voltages are applied to the unselected word lines to turn on (make conductive) the unselected storage elements so that a sensing operation such as a verify operation can occur for the selected word line. Next ("3"), storage elements on WLn are programmed in a second programming phase ($2^{nd}$ pass). Next ("4"), storage elements on WLn+2 are programmed in a first programming phase for that word line. Next ("5"), the storage elements on WLn+1 are programmed in a second programming phase to their final respective states. Example bit lines BLi−1, BLi and BLi+1 are depicted.

By programming the word lines in phases, in a back and forth manner, capacitive coupling effects which tends to raise and widen their threshold voltage distributions, are reduced. In contrast, in single-phase programming, each word line is programmed completely before moving to the next word line.

Figure 7B:
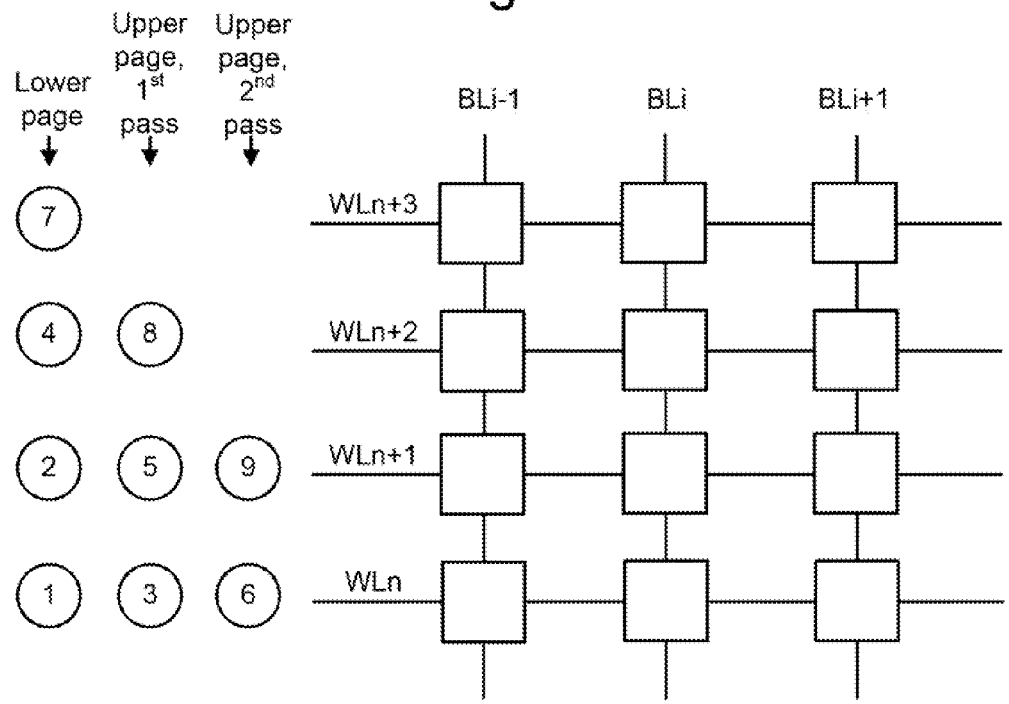
FIG. 7B depicts a three-phase programming operation for a set of storage elements in a back-and-forth word line order.

FIG. 7B depicts a three-phase programming operation for a set of storage elements in a back-and-forth word line order. An initial program phase of a lower page (Lower page) is performed before first and second passes of an upper page (Upper page $1^{st}$ pass and Upper page $2^{nd}$ pass, respectively). A first phase programs a lower page of data, a second phase programs an upper page of data in a first pass, and a third phase completes programming of the upper page of data in a second pass. At "1", a first phase is performed for WLn, at "2" a first phase is performed for WLn+1, at "3" a second phase is performed for WLn, at "4" a first phase is performed for WLn+2, at "5" a second phase is performed for WLn+1, at "6" a third phase is performed for WLn, at "7" a first phase is performed for WLn+3, at "8" a second phase is performed for WLn+2, at "9" a third phase is performed for WLn+1, and so forth. Example bit lines BLi−1, BLi and BLi+1 are depicted.

Figure 8A:
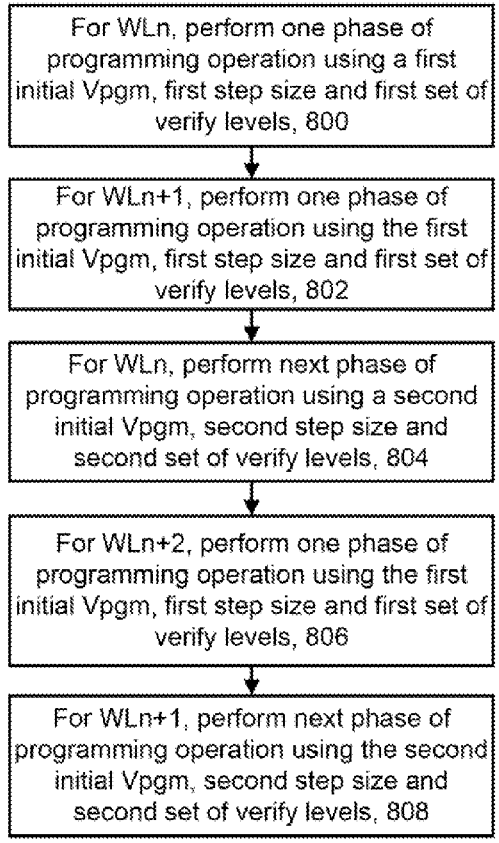
FIG. 8A depicts an overview of a multi-phase programming operation.

FIG. 8A depicts an overview of a multi-phase programming operation. Step 800 includes, for WLn, performing one phase of a programming operation using a first initial Vpgm, first step size and first set of verify levels. In examples provided below, this phase can be a so-called "foggy" phase, which is the first phase of a two-phase programming operation or a second phase of a three-phase programming operation. The first set of verify levels can include VvaL, VvbL, VvcL, in a four-level memory device, or VvaL, VvbL, VvcL, VvdL, VveL, VvfL and VvgL in an eight-level memory device. Step 802 includes, for WLn+1, performing one phase of a programming operation using the first initial Vpgm, the first step size and the first set of verify levels. Step 804 includes, for WLn, performing a next phase of a programming operation using a second initial Vpgm, a second step size and a second set of verify levels. The second set of verify levels can include Vva, Vvb, Vvc, in a four-level memory device, or Vva, Vvb, Vvc, Vvd, Vve, Vvf and Vvg in an eight-level memory device. The verify levels of the first set are offset from the verify levels of the second set, such that each verify level of the first set is lower than a respective verify level of the second set.

Step 806 includes, for WLn+2, performing one phase of a programming operation using the first initial Vpgm, the first step size and the first set of verify levels. Step 808 includes, for WLn+1, performing a next phase of the programming operation using the second initial Vpgm, the second step size and the second set of verify levels. The process continues accordingly until all data has been programmed.

Figure 8B:
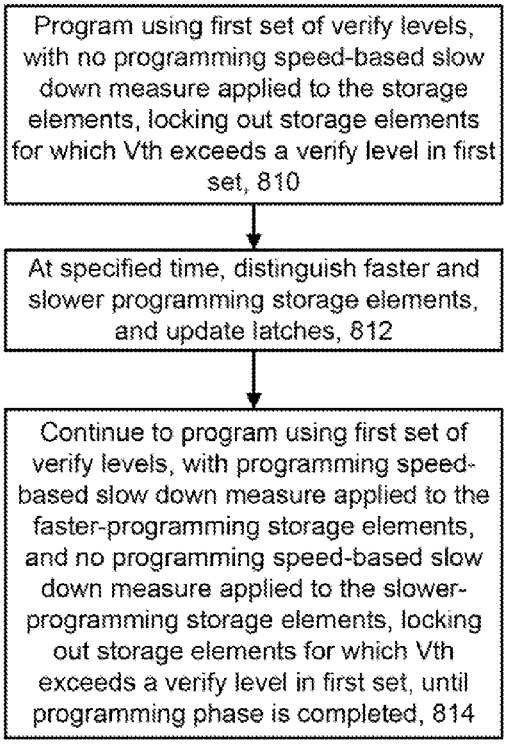
FIG. 8B depicts details of step 800, 802 or 806 of the multi-phase programming operation of FIG. 8A.

FIG. 8B depicts details of step 800, 802 or 806 of the multi-phase programming operation of FIG. 8A. Step 810 includes programming using the first set of verify levels, with no slow down measure applied to the selected storage elements. Storage elements for which the Vth exceeds a verify level in the first set are locked out from further programming, such as by raising an associated bit line voltage to a level which is sufficiently high to shut off the SGD during programming and isolate the associated channel leading to boosting which inhibits the storage element from further programming. At step 812, at a specified time, e.g., when a specified trigger condition is detected, faster and slower-programming storage elements are distinguished. This distinguishing can occur for all programmed data states (data states other than the erased state), for instance. Latches are updated with information (programming speed data) which identifies and distinguishes the faster- and slower-programming storage elements. For example, one bit value (0 or 1) in the latch associated with a storage element may indicate a slow status, and the other bit value (1 or 0) may indicate a fast status.

Note that the "slow" and "fast" notations here refer to the position of the storage element's Vth in the natural Vth distribution. During programming, as the natural Vth distribution moves higher, a steady state is reached under which all storage elements Vth shift at almost the same pace (typically the Vth shift up after one program pulse is close to the Vpgm-step size used during programming). But since natural Vth distribution is in close to a Gaussian distribution shape, half the storage elements belong to the higher half or the leading half of the distribution. These storage elements are referred to as being "fast," while the storage elements in the other, lagging half are referred to as "slow." The measure of slowness or fastness of the storage element simply denotes how close or far is that storage element's Vth from the extreme lower and upper tails of the natural Vth distribution.

Step 814 includes continuing to program using the first set of verify levels, while applying a programming speed-based slow down measure to the faster-programming storage elements, and without applying a programming speed-based slow down measure to the slower-programming storage elements. In one approach, before every subsequent remaining program pulse of the current programming phase, the programming speed data is read from the latches and used to determine whether or not to apply a slow down measure for each storage element. For example, control circuitry on the memory chip (e.g., sense blocks 100, FIGS. 1 and 3) can read the data latches. Assume a "0" in the latch indicates a faster programming storage element, and a "1" in the latch indicates a slower programming storage element. If a "0" is read, then a slow down measure is applied, responsive to the latch. If a "1" is read, then a slow down measure is not applied, responsive to the latch. By the time the next program pulse occurs, the control circuitry on the memory chip has lost the history of what bit line bias was used on each storage element on the previous programming pulse. So, the control circuitry needs to read the latches again to determine which storage elements need to receive the slow down measure. This process is repeated for each program pulse on which the slow down measure is applied, irrespective of the programming phase.

Storage elements whose threshold voltage exceeds a verify level in the first set of verify levels are locked out. This programming continues until the programming phase is completed. A programming speed-based slow down measure is meant to distinguish over any other type of slow down measure which is not based on a detected programming speed, and which might be applied. For example, in some cases, an elevated bit line voltage is applied based on the threshold voltage of a storage element as it nears a target verify level. The programming speed-based slow down measure can be an additional increase in the bit line voltage in this case.

Figure 8C:
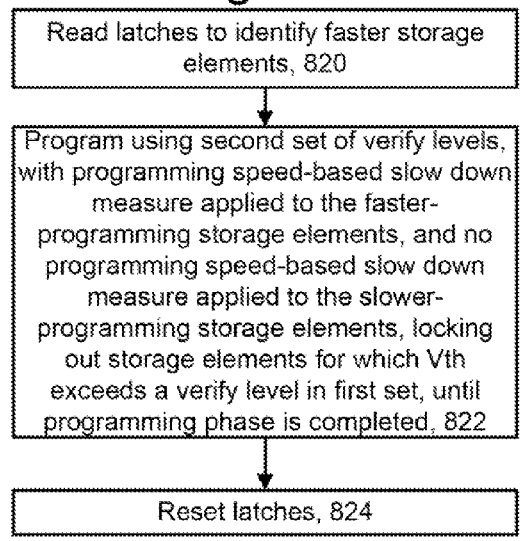
FIG. 8C depicts details of step 804 or 808 of the multi-phase programming operation of FIG. 8A.

FIG. 8C depicts details of step 804 or 808 of the multi-phase programming operation of FIG. 8A. At step 820, the set of latches in which programming speed data was stored in step 812, is read to identify the faster- and slower-programming storage elements. Step 822 includes programming using a second set of verify levels, where each level of the second set is higher than a corresponding level in the first set. A programming speed-based slow down measure is applied to the faster-programming storage elements, while no programming speed-based slow down measure is applied to the slower storage elements. Storage elements whose threshold voltage exceeds a verify level in the second set of verify levels are locked out. This is done until the programming phase is completed. This may also represent the completion of the entire programming operation in which case, at step 824, the latches are reset so that they can be used by storage elements on another word line.

Figure 8D:
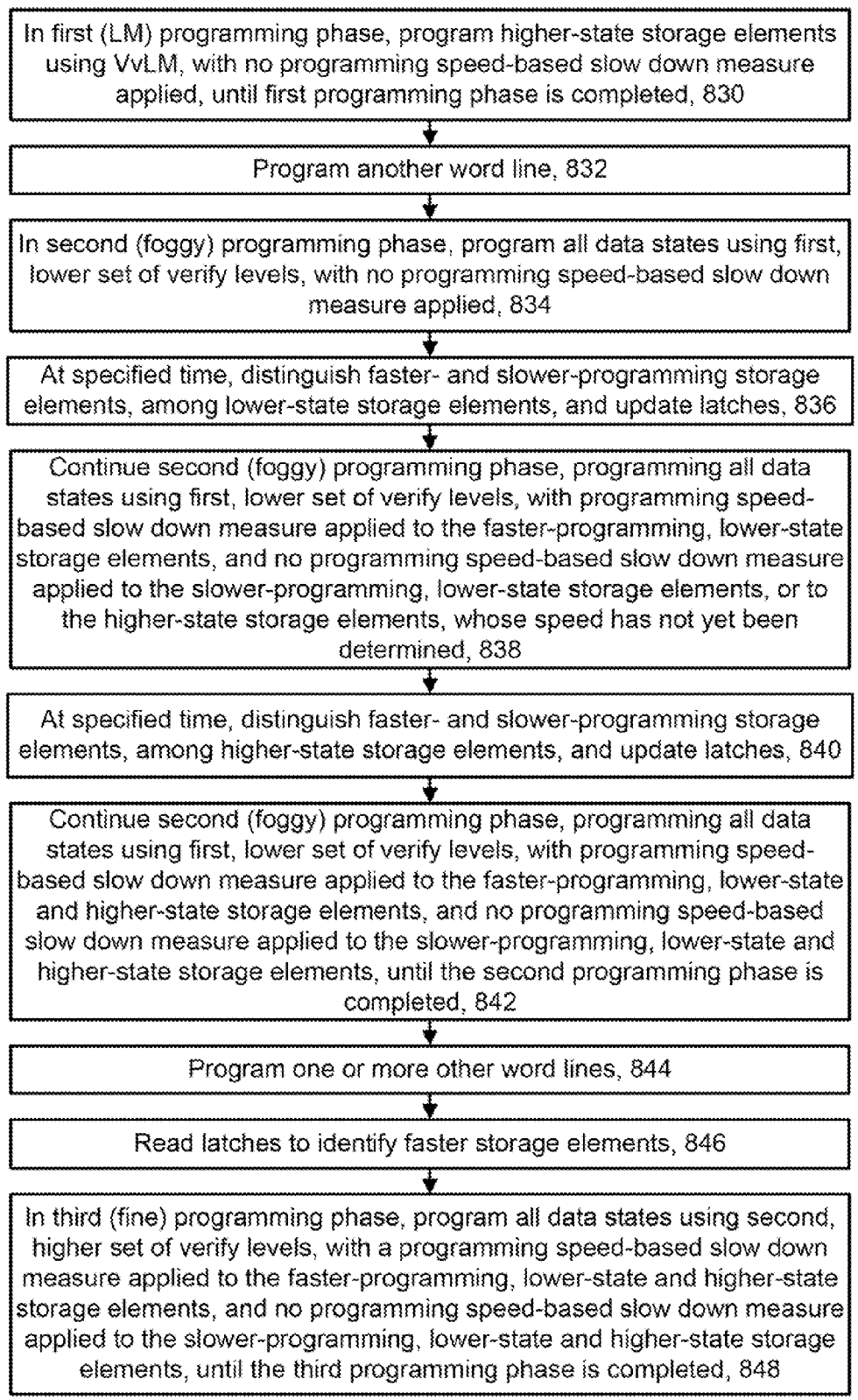
FIG. 8D depicts details of steps 800 and 804 in connection with a three-phase programming operation, in which faster- and slower-programming storage elements are distinguished for lower-state storage elements before higher-state storage elements, in a second phase of the three-phase programming operation.

FIG. 8D depicts details of steps 800 and 804 in connection with a three-phase programming operation, in which faster- and slower-programming storage elements of a specified nth word line, WLn, are distinguished for lower-state storage elements before higher-state storage elements, in a second phase of the three-phase programming operation. Step 830, in a first programming phase, referred to as an LM (lower-middle) phase, programs higher-state storage elements using VvLM, with no programming speed-based slow down measure applied, until the first programming phase is completed. VvLm is a verify level for an intermediate (LM) —see FIG. 11A. The first programming phase is completed when the Vth of all of the higher-state storage elements reaches VvLM. No programming speed detection has yet been performed.

Note that the reference to "all" the storage elements which are to be programmed to a verify level is meant to include all storage elements which are not ignored. For example, a page of data can be 8 KB stored in 64 K storage elements. A small portion of the storage elements will be defective, having a physical defect, or some other issue which can make them very slow to program, requiring extra program pulses. For example, evaluations may determine that 32 out of 64 K storage elements, on average, may be defective. So, during programming, without specifically knowing which bits are good or bad, we may choose to ignore 32 bits, and do not force them to program. From a programming performance point of view, it is more efficient to ignore a few storage elements and use the ECC to correct them. The number of storage elements to be ignored can be determined by parameters on a ROM fuse.

Lower-state storage elements are not programmed in this phase, and remain in the erased state. In a four-state implementation, the lower state may be the A-state and the higher states may be the B- and C-states. In an eight-state implementation, the lower states may be the A-, B- and C-states and the higher states may be the D-, E-, F- and G-states. Sixteen-state or other implementations are also possible. A lower-state storage element is intended to be programmed to a lower target data state by the completion of a programming operation, to represent data of that target data state. Similarly, a higher-state storage element is intended to be programmed to a higher target data state by the completion of a programming operation, to represent data of that target data state.

Once the first programming phase is completed for WLn, another word line may be programmed at step 832. This can be the first, LM programming phase for WLn+1, for instance (see FIG. 7B).

At step 834, a second programming phase, referred to as a foggy phase, begins. Here, storage elements having all target data states are programmed using a first, lower set of verify levels, with no programming speed-based slow down measure applied. No programming speed detection has yet been performed.

At step 836, at a specified time, faster- and slower-programming storage elements are distinguished, among the lower-state storage elements, and latches are updated accordingly. Faster- and slower-programming storage elements are not yet distinguished among the higher-state storage elements. Example implementations for distinguishing faster- and slower-programming storage elements are discussed further below.

At step 838, the second (foggy) programming phase continues, with programming of all data states using the first, lower set of verify levels. Additionally, a programming speed-based slow down measure is applied to the faster-programming, lower-state storage elements, and no programming speed-based slow down measure is applied to the slower-programming, lower-state storage elements, or to the higher-state storage elements, whose speed has not yet been determined.

At step 840, at a specified time, faster and slower-programming storage elements are distinguished among the higher-state storage elements, and latches are updated accordingly. A common set of latches can be updated in steps 836 and 840.

At step 842, the second (foggy) programming phase continues, with programming of all data states using the first, lower set of verify levels. A programming speed-based slow down measure is applied to the faster-programming, lower-state and higher-state storage elements, and no programming speed-based slow down measure is applied to the slower-programming, lower-state and higher-state storage elements. This continues until the second programming phase is completed. The second programming phase is completed when the Vth of all of the storage elements, less a bit ignore number of storage elements, reaches an associated verify level in the first, lower set of verify levels.

Step 844 includes programming one or more other word lines. For instance, this can include the first, LM phase for WLn+2 (see item "4" in FIG. 7B) followed by the second phase for WLn+1 (see item "5" in FIG. 7B).

At step 846, as programming of WLn begins for the third phase, the latches are read to identify the faster-programming storage elements.

Step 848 involves a third (fine) programming phase, which programs all data states using a second, higher set of verify levels. Additionally, a programming speed-based slow down measure is applied to the faster-programming, lower-state and higher-state storage elements, and no programming speed-based slow down measure is applied to the slower-programming, lower-state and higher-state storage elements. This continues until the third programming phase, and the overall programming operation, is completed. The third programming phase is completed when the Vth of all of the storage elements, less a bit ignore number of storage elements, reaches an associated verify level in the second, higher set of verify levels.

FIG. 8E depicts details of steps 800 and 804 in connection with a three-phase programming operation, in which faster- and slower-programming storage elements are distinguished for higher-state storage elements in a first phase of the three-phase programming operation, and in which faster- and slower-programming storage elements are distinguished for lower-state storage elements in a second phase of the three-phase programming operation. This is an alternative to FIG. 8D.

At step 860, in the first (LM) programming phase, higher-state storage elements are programmed using VvLM, with no programming speed-based slow down measure applied. At step 862, at a specified time, faster- and slower-programming storage elements are distinguished among higher-state storage elements, and latches are updated accordingly.

Step 864 continues the first (LM) programming phase, by programming the higher-state storage elements using VvLM, with a programming speed-based slow down measure applied to the faster-programming, higher-state storage elements, and no programming speed-based slow down measure applied to the slower-programming, higher-state storage elements. This continues until the programming phase is completed.

Step 866 includes programming another word line. For instance, this can be the first, LM phase for WLn+1 (see item "2" in FIG. 7B).

At step 868, the second (foggy) programming phase begins, by programming all data states using a first, lower set of verify levels, with a programming speed-based slow down measure applied to the faster-programming, higher-state storage elements, and no programming speed-based slow down measure applied to the slower-programming, higher-state storage elements, or to the lower-state storage elements, whose speed has not yet been determined.

Steps 836, 842, 844, 846 and 848 are performed as discussed in connection with FIG. 8D.

Figure 9A:
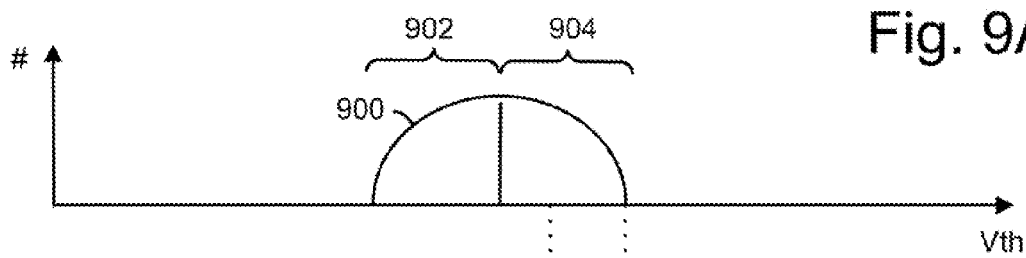
FIG. 9A depicts a natural threshold voltage distribution of a set of storage elements, including faster and slower-programming storage elements.

FIG. 9A depicts a natural threshold voltage distribution 900 of a set of storage elements, including faster 904 and slower 902 programming storage elements. The x-axis depicts threshold voltage (Vth) and the y-axis depicts a number (#) of storage elements. The natural Vth distribution may be defined as a Vth distribution which is seen when a set of storage elements is in a steady state condition in which an approximately constant change in Vth is seen with each program pulse. For instance, a few program pulses can be applied to the set of storage elements, with no verify or lockout operations, to achieve and measure a distribution which represents the natural Vth distribution.

As mentioned, when the natural Vth distribution becomes wider, the number of verify operations which are required for each data state also increases, degrading programming performance by increasing the overall programming time. To overcome this problem, the natural Vth distribution can be decreased in a multi-phase programming operation by detecting faster-programming storage elements and applying a programming speed-based slow down measure, such as a raised bit line voltage, in one or more of the programming phases. A "programming speed-based slow down measure" which is imposed on a storage element is a slow down measure which is based on a previously detected programming speed of the storage element, e.g., a determination that the storage element is a relatively fast programming storage element in a set of storage elements of a word line. We propose a scheme that can artificially tighten the natural Vth distribution by reducing the programming speed difference between the faster- and slower-programming storage elements, by slowing down the fast storage elements.

The fast storage elements are identified during a programming phase for a given word line, and this information is saved in data latches. Using this information, the fast storage elements are slowed down by applying a bit line bias during programming. This effectively tightens the natural Vt distribution and hence reduces the number of verify operations needed to finish programming of all the storage elements. This approach can improve the programming performance without significantly affecting the programmed Vth distributions and hence avoid increasing the number of errors. By slowing only the faster-programming storage elements, their programming speed becomes closer to that of the slower storage elements, effectively tightening the natural Vt distribution.

Figure 9B:
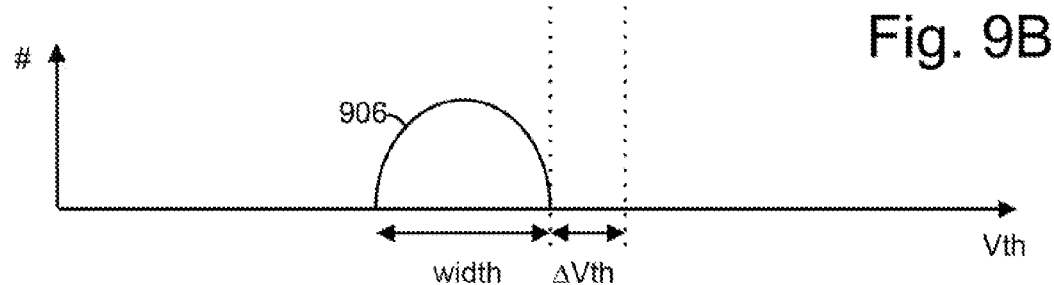
FIG. 9B depicts a tightened natural threshold voltage distribution of a set of storage elements.

FIG. 9B depicts a tightened natural threshold voltage distribution 906 of a set of storage elements and its width. The x-axis depicts threshold voltage (Vth) and the y-axis depicts a number (#) of storage elements. The distribution is tightened by an amount ΔVth. Here, for description purposes, it is shown that the natural Vth distribution maintains its Gaussian distribution shape even after the tightening or compaction, but in reality the distribution would lose its Gaussian shape because of redistribution of storage element's Vth in the distribution after compaction.

Figure 9C:
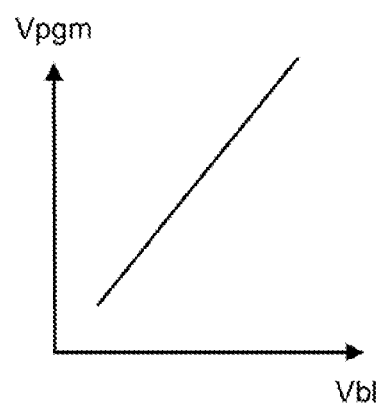
FIG. 9C depicts a relationship between the Vpgm needed to program a storage element and a bit line voltage of the storage element.

FIG. 9C depicts a relationship between the Vpgm needed to program a storage element and a bit line voltage applied to the bit line associate with that storage element. The x-axis depicts increasing bit line voltage (Vbl) and the y-axis depicts the Vpgm which is needed to complete programming of a storage element. Thus, at a given Vpgm, if Vbl is applied to the bit line associated with a storage element, the programming speed for that storage element can be reduced.

Generally, the degree to which the programming speed of a storage element is slowed is proportional to the bit line voltage by a constant which is the slope of the curve depicted. The constant is typically greater than one because an increase of 1 V in Vbl, e.g., ΔVbl=1 V, requires an increase of more than 1 V by Vpgm to offset. In FIG. 9B, ΔVth is equal to the constant multiplied by ΔVbl. Increasing Vbl is therefore a powerful tool to control programming speed and tighten the natural Vth distribution.

However, Vbl cannot be made too high, as it is mainly limited by the Vsgd (drain-side select gate) margin-window.

Specific example implementations are discussed next for two-phase and three-phase programming operations. The techniques could be extended to additional phases as well.

FIG. 9D depicts example programming scenarios. In Example 1, the storage elements each store two bits, two programming phases are used, and programming speed data is obtained for all storage elements of all programmed states in the first phase. In Example 2, the storage elements each store two bits, three programming phases are used, and programming speed data is obtained for higher-state storage elements in the first phase. In Example 3, the storage elements each store two bits, three programming phases are used, and programming speed data is obtained for higher-state storage elements in the first phase, and lower-state storage elements in the second phase. In Example 4, the storage elements each store two bits, three programming phases are used, and programming speed data is obtained for lower-state storage elements and then the higher-state storage elements in the second phase. In Example 5, the storage elements each store three bits, three programming phases are used, and programming speed data is obtained for higher-state storage elements in the first phase, and lower-state storage elements in the second phase. In Example 6, the storage elements each store three bits, three programming phases are used, and programming speed data is obtained for lower-state storage elements and then the higher-state storage elements in the second phase. Each of these examples is discussed below.

EXAMPLE 1

A first implementation involves the sequence of: FIGS. 10A, 10B, 10C, 10E, 10F and 10G. A second implementation involves the sequence of: FIGS. 10A, 10B, 10D, 10E, 10F and 10G. In this example, the flow from FIG. 10A to 10E corresponds, e.g., to step "1" in FIG. 7A, and the flow from FIG. 10F to 10G corresponds to step "3" in FIG. 7A. The use of latches is explained in the corresponding steps of FIG. 16B. In both implementations, programming speed data is obtained in a first phase for all storage elements, the information is saved to a data latch, and a programming speed-based slow down measure is applied to faster-programming storage elements in a remainder of the first phase, and in the entire second phase.

Figure 10A:
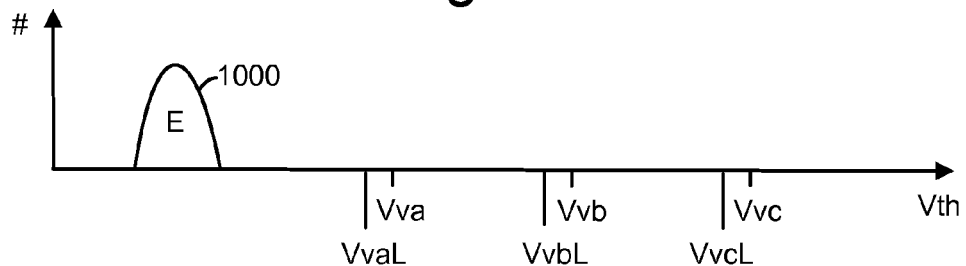
FIG. 10A depicts a start of a first phase of a two-phase programming operation in which all storage elements are in the erased state.

FIG. 10A depicts a start of a first phase of a two-phase programming operation in which all storage elements are in the erased state. Distribution 1000 represents the erased (E) state. VvaL, VvbL and VvcL are a first set of lower, verify levels, and Vva, Vvb and Vvc are a second set of higher, verify levels. In some cases, one or more of the highest data states may not use a lower verify level since a wider distribution can be tolerated.

Figure 10B:
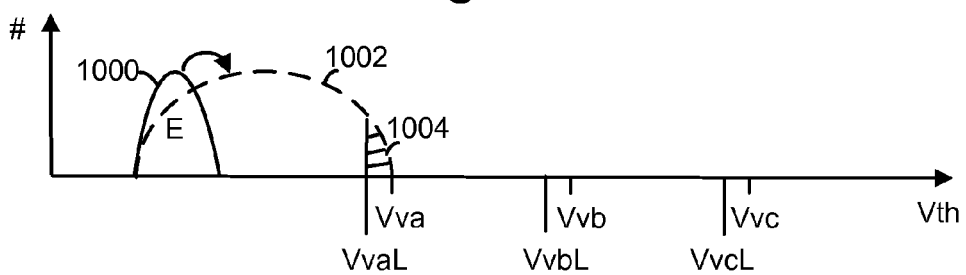
FIG. 10B depicts a condition which follows FIG. 10A, in which a minimum number of storage elements have a Vth>VvaL, in the first phase of the two-phase programming operation.

FIG. 10B depicts a condition which follows FIG. 10A, in which a minimum number of storage elements have a Vth>VvaL, in the first phase of the two-phase programming operation. Here, a number of program pulses have been applied in successive program-verify iterations. Regarding verify operations, note that not all target states need to be verified after every program pulse. Instead, the specific states which are verified can be tailored to the progress of the overall programming phase, such that early in the programming phase, the lower states are verified but not the higher states, then most or all states are verified, and then, as all the lower state storage elements lock out, the higher states are verified but not the lower states. A width of the distribution 1002 may be comparable to, or smaller than, the natural Vth distribution. As program pulses are applied, the threshold voltage of the storage elements increases steadily. When a minimum number of storage elements reach VvaL, for instance, that is, their Vth exceeds VvaL, a condition is met which triggers a counter. A region 1004 of the distribution 1002 represents the storage elements for which Vth>VvaL. The number of storage elements which reach VvaL can be determined from a bit scan of latches in sense amplifiers which store data indicating the result of a verify operation. In a verify operation, a bit will be flipped in the sense amplifier when a storage element and its bit line are sensed to be non-conductive, indicating Vth>VvaL. Note that the verify operation at VvaL can be performed for all storage elements, regardless of their target data state.

Each additional program pulse is counted until a specified number of m>0 pulses are applied. This number can be set based on the typical expected natural Vth distribution width of the non-volatile storage elements, so that a specified portion, approximately, of the non-volatile storage elements of the target word line have a threshold voltage which exceeds VvaL when the counting is completed. The specified portion can be one-half, so that half of the storage elements are classified as being faster-programming and the other half are classified as being slower-programming. The specific portion is a number "m" which can be optimized over multiple memory devices across multiple lots to obtain a suitable value that can maximize the benefit in terms of programming performance. When the count is completed, a verify operation is performed at VvaL to identify faster-programming storage elements as those having a Vth>VvaL, so that they are non-conductive in the verify operation, and the slower-programming storage elements have a Vth<VvaL, so that they are conductive in the verify operation. A bit can be set in a set of data latches, such as in DL1 (see FIG. 3, 16A1-16E) which identifies the fast or slow status of each storage element for the specific word line.

VvaL is a defined verify level which can be chosen as a suitable checkpoint for distinguishing program speed since it also serves to verify the storage elements having the A-state as their target data state. The A-state storage elements can be locked out from further programming in the current programming phase when their Vth exceeds VvaL, while B- and C-state storage elements will continue to program until they reach VvbL and VvcL, respectively. Instead of VvaL, it is possible to use another verify level, associated or not with a target data state, as a condition for triggering the counting of pulses, and/or for distinguishing faster- and slower-programming storage elements.

Figure 10C:
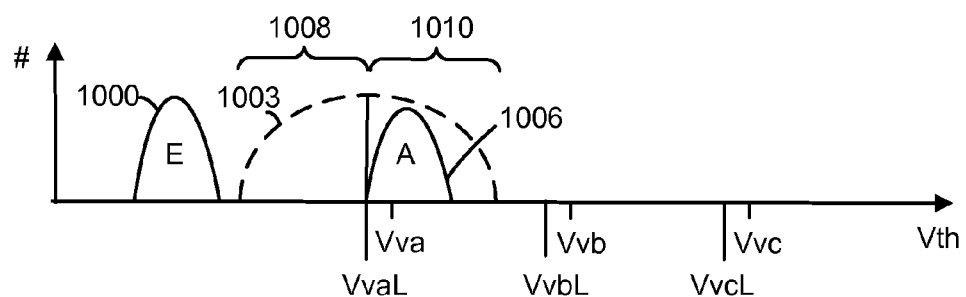
FIG. 10C depicts a first alternative which follows FIG. 10B, after an additional number of "m" program pulses have been applied, where faster- and slower-programming storage elements are distinguished using the verify level of VvaL, in the first phase of the two-phase programming operation.

FIG. 10C depicts a first alternative which follows FIG. 10B, after an additional number of "m" program pulses have been applied, where faster- and slower-programming storage elements are distinguished using the verify level of VvaL, in the first phase of the two-phase programming operation. Here, the Vth distribution 1003 includes regions 1008 and 1010 for the slower and faster-programming storage elements, respectively. The distribution 1006 represents a portion of the storage elements which have the A-state as the target state and which have reached VvaL. Note that the storage elements in distribution 1006 would automatically be the faster storage elements since they reached the target A-state earlier than rest of the storage elements. The distinguishing of the faster- and slower-programming storage elements occurs when a condition is satisfied, such as the counting of an additional number of program pulses which have been applied.

Figure 10D:
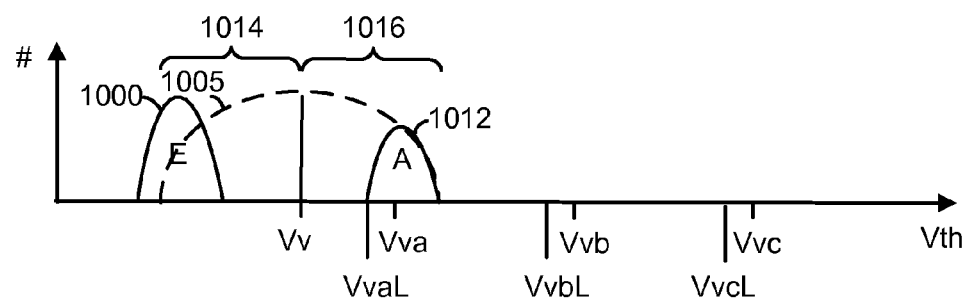
FIG. 10D depicts a second alternative which follows FIG. 10B, after an additional number of "k" program pulses have been applied, and faster- and slower-programming storage elements are distinguished using the read level of Vv, in the first phase of the two-phase programming operation.

FIG. 10D depicts a second alternative which follows FIG. 10B, after an additional number of "k" program pulses have been applied, and faster- and slower-programming storage elements are distinguished using the read level of Vv, in the first phase of the two-phase programming operation. Vv is not associated with a target data state. In one approach, Vv is also used for a read operation for the set of non-volatile storage elements, such as to distinguish the E- and A-states.

For instance Vv can be below VvaL by about one-half of the width of the natural Vth distribution. Alternatively, the distinguishing can occur when the minimum number of storage elements reach VvaL without counting additional program pulses. Here, the Vth distribution 1005 includes regions 1014 and 1016 for the slower and faster-programming storage elements, respectively. The distribution 1012 represents a portion of the storage elements which have the A-state as the target state and which have reached VvaL. Note that the storage elements in distribution 1012 would automatically be the faster storage elements since they reached the target A-state earlier than rest of the storage elements. It is possible to distinguish two or more classes of storage elements based on programming speed using appropriate verify levels. Generally, k<m, k>0 and m>0, so that the programming speed determination can be made sooner when a k count is used as in FIG. 10D, that when the m count is used as in FIG. 10C. An advantage of distinguishing the faster- and slower-programming storage elements sooner is that this information can be used sooner to slow down the faster-programming storage elements, thereby tightening the natural Vth distribution for subsequent program pulses. A disadvantage of this approach is that an additional sensing operation at Vv is needed. Also, programming speed data may be less reliable if it is obtained too soon in the programming phase, such as before the Vth distribution of the storage elements has spread out to a width which is close to the natural Vth distribution, and the storage elements have reached their steady state under which their Vth shifts up at a rate close to the Vpgm step size. An advantage of the approach of FIG. 10C is that no additional sensing operation is needed because VvaL is already used as a verify level which is associated with a target state.

Figure 10E:
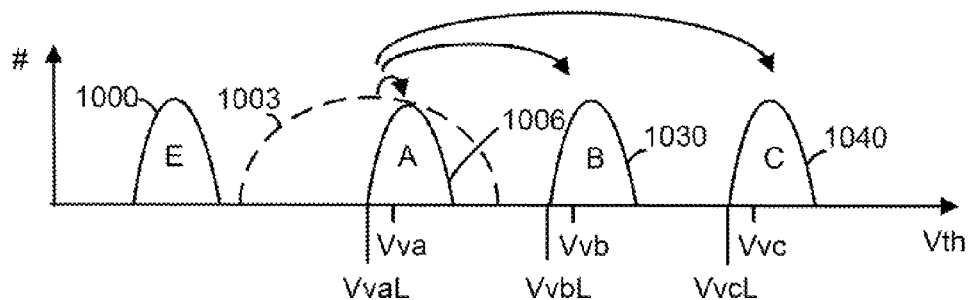
FIG. 10E depicts programming in the first phase of the two-phase programming operation, from the condition of either FIG. 10C or 10D.

FIG. 10E depicts programming in the first phase of the two-phase programming operation, from the condition of either FIG. 10C or 10D. Continued programming from the distribution 1003 of FIG. 10C is depicted, as the rest of A-state storage elements are programmed to VvaL (distribution 1006), B-state storage elements are programmed toward VvbL (distribution 1030) and the C-state storage elements are programmed toward VvcL (distribution 1040) or Vvc if no lower verify level is used. Note that in the first phase of the two-phase programming operation, a larger Vpgm step size can be used as depicted by the waveform 602 in FIG. 6. The distribution of FIG. 10F is reached at the end of the first phase.

Figure 10F:
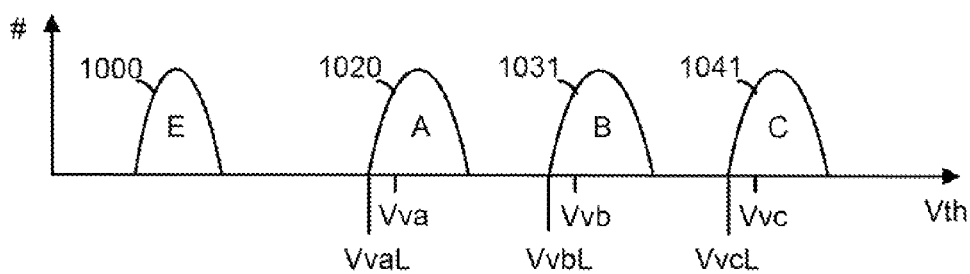
FIG. 10F depicts a condition which follows FIG. 10E, at a start of a second phase of the two-phase programming operation.

FIG. 10F depicts a condition which follows FIG. 10E, at a start of a second phase of the two-phase programming operation. The second phase may use a smaller Vpgm step as depicted by the waveform 600 in FIG. 6, so that the Vth of the storage elements increases more slowly, avoiding large overshoots of the target verify level. It is also possible to implement a raised bit line which is not based on programming speed, but which is applied when the Vth of a storage element is between the lower and upper verify levels of the target data states, and/or is in a specified programming phase. This is an additional slow down measure, which is not a programming speed-based slow down measure, and which can be implemented with a programming speed-based slow down measure, e.g., as an additional Vbl increase. Note that the distributions 1020, 1031 and 1041 of the A, B and C states, respectively, are shown as being widened, relative to distributions 1006, 1030 and 1040, respectively, due to capacitive coupling and other interference effects when one or more other word lines are programmed between the first and second phases.

Figure 10G:
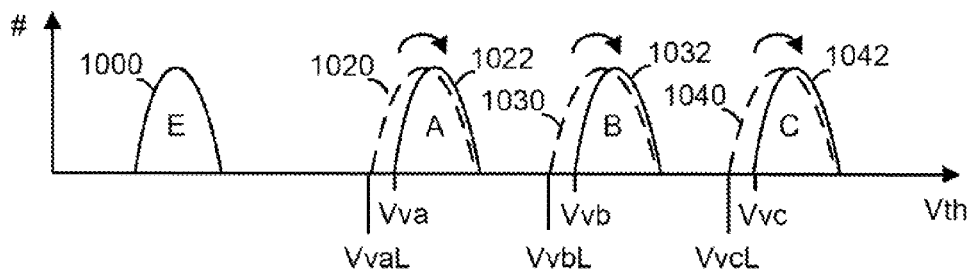
FIG. 10G depicts programming in the second phase of the two-phase programming operation, from the condition of FIG. 10F.

FIG. 10G depicts programming in the second phase of the two-phase programming operation, from the condition of FIG. 10F. A second set of verify levels is used, namely Vva, Vvb and Vvc to provide the transitions to distributions 1022, 1032 and 1042. Advantageously, the Vth distributions 1022, 1032 and 1042 are tightened compared to the distributions 1020, 1031 and 1041. Generally, when Vth distributions are tightened, the upper-tails of the distributions move slightly, while the major movement is on lower-tails.

EXAMPLE 2

Another implementation involves the sequence of: FIGS. 11A, 11B, 11C, 11D, 11E, 11F and 11G. In a first phase, programming speed data is obtained for higher-state storage elements, the information is saved to a data latch, and a programming speed-based slow down measure is applied to faster-programming, higher-state storage elements in a remainder of the first phase, and in the entire second and the third phase. Programming speed data is not obtained for lower-state storage elements in the programming operation.

Figure 11D:
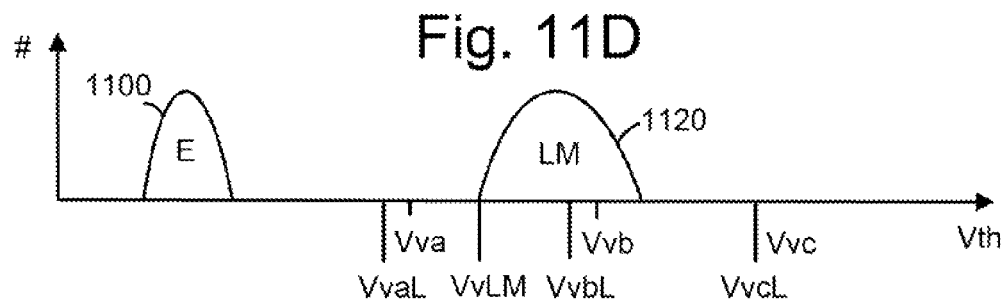
FIG. 11D depicts a condition which follows FIG. 11C, at the start of a second phase of the three-phase programming operation.
Figure 11E:
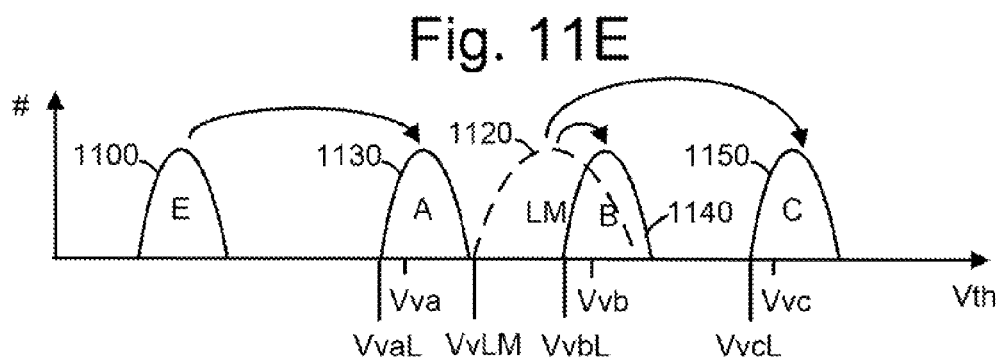
FIG. 11E depicts programming of lower- and upper-state storage elements, following the condition of FIG. 11D, in the second phase of the three-phase programming operation.
Figure 11F:
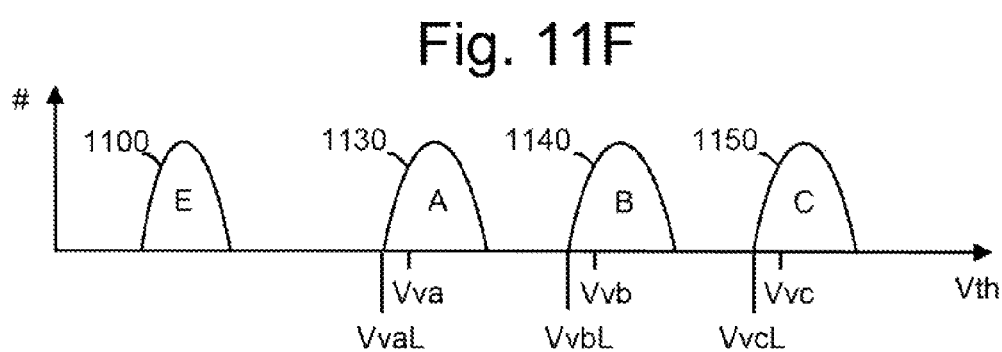
FIG. 11F depicts a start of a third phase of the three-phase programming operation, following the condition of FIG. 11E.
Figure 11G:
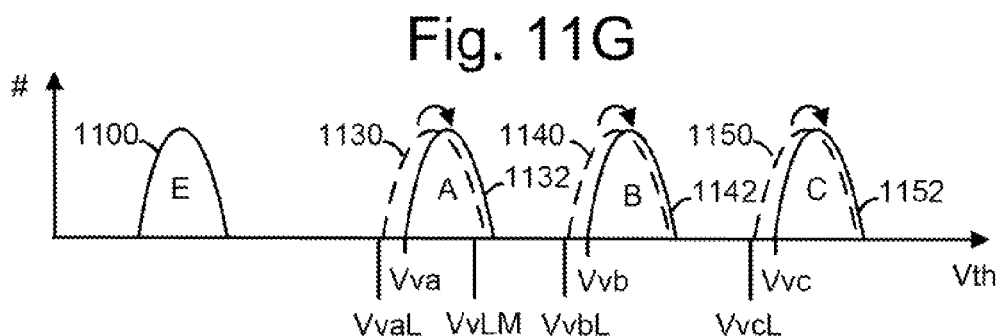
FIG. 11G depicts programming in a third phase of the three-phase programming operation, from the condition of FIG. 11F.

In this example, the flow from FIG. 11A to 11D corresponds, e.g., to step "1" in FIG. 7B, the flow from FIG. 11E to 11F corresponds to step "3" in FIG. 7B, and the flow in FIG. 11G corresponds to step "6" in FIG. 7B. The use of latches is explained in the corresponding steps of FIG. 16C1 or 16C2.

FIG. 11A depicts a start of a first phase of a three-phase programming operation in which all storage elements are in the erased state, for a four-level memory device. The first phase can be the LM phase discussed previously in which lower-state storage elements remain in the erased state 1100 while higher-state storage elements are programmed to an intermediate (LM) state using the verify level VvLM.

FIG. 11B depicts a condition which follows FIG. 11A, in which a minimum number of higher-state storage elements have a Vth>VvLM, in the first phase of the three-phase programming operation. In the distribution 1102, a region 1104 represents the higher-state storage elements for which Vth>VvLM. Once a minimum number of the higher-state storage elements reach VvLM, a counter is started, and incremented for each additional program pulse. The first phase can use a relatively larger Vpgm step size.

FIG. 11C depicts a condition which follows FIG. 11B, after an additional number of "m" program pulses have been applied, where faster- and slower-programming upper-state storage elements are distinguished using the read level of Vvh, in the first phase of the three-phase programming operation. Upon completion of the counting of the m>1 additional program pulses, the Vth distribution 1103 includes regions 1108 and 1110 for the slower and faster-programming higher-state storage elements, respectively. The distribution 1106 represents a portion of the higher-state storage elements which have been verified to have reached VvLM. Note that the storage elements in distribution 1106 would automatically be the faster storage elements since they reached the target LM-state earlier than rest of the storage elements. Vvh is a higher read level because it is used to verify the higher-state storage elements. During a remainder of the first phase, when each program pulse is applied, no programming speed-based slow down measure is applied to the slower-programming, higher-state storage elements while a programming speed-based slow down measure is applied to the faster-programming, higher-state storage elements.

FIG. 11D depicts a condition which follows FIG. 11C, at the start of a second phase of the three-phase programming operation. Programming continues from FIG. 11C so that the distribution 1103 transitions to the distribution 1120, where all higher-state storage elements have reached the intermediate (LM) state, at the end of the first phase. Between the first and second phases, another word line is programmed. Just before starting the second phase on the target word line, the latches are read to identify the faster- and slower-programming higher-state storage elements on the target word line. Using the information in the latches, the slower-programming, higher-state storage elements can be treated in a nominal manner such as by not applying a programming speed-based slow down measure. In contrast, a programming speed-based slow down measure such as an increased bit line voltage can be applied to the faster-programming, higher-state storage elements when each program pulse is applied. Note that no programming speed data has been, or will be, obtained for the lower-state storage elements, in this example. The application of a programming speed-based slow down measure to the faster-programming B-state and C-state storage elements only, can still provides a benefit in reducing the effective natural Vth distribution for B- and C-state storage elements and hence reduce the number of verify operations needed for B- and C-states, thus improving program performance.

FIG. 11E depicts programming of lower- and upper-state storage elements, following the condition of FIG. 11D, in the second phase of the three-phase programming operation. In this phase, the lower-state storage elements either remain in the erased state or are programmed to the A-state (distribution 1130) using VvaL, with no programming speed-based slow down measure applied. The higher-state storage elements are programmed from the Intermediate (LM) state to the B-state (distribution 1140) or C-state (distribution 1150) using VvbL and VvcL, respectively, with a programming speed-based slow down measure applied, until the distribution of FIG. 11F is reached at the end of the second phase. The second phase can use a relatively larger Vpgm step size.

Note that, in some embodiments, the Vth transitions for the lower-state storage elements will typically occur before the Vth transitions for the higher-state storage elements. This is true because Vpgm is stepped up from a low initial level, and is initially high enough only to move the Vth of the lower-state storage elements. Only when Vpgm gets higher will the Vth of the higher-state storage elements start to increase. A similar observation holds for other figures.

FIG. 11F depicts a start of a third phase of the three-phase programming operation, following the condition of FIG. 11E. The third phase can use a relatively smaller Vpgm step size. Note that the Vth distributions can widen due to coupling and interference effects when one or more other word lines are programmed.

FIG. 11G depicts programming in a third phase of the three-phase programming operation, from the condition of FIG. 11F. The A-state storage elements are programmed to the distribution 1132 using Vva, with no programming speed-based slow down measure applied, the B-state storage elements are programmed to the distribution 1142 using Vvb, and the C-state storage elements are programmed to the distribution 1152 using Vvc. Just like at the start of second phase, before starting the third phase on the target word line, the latches are read to identify the faster- and slower-programming higher-state storage elements on the target word line. Using the information in the latches, a programming speed-based slow down measure is applied to the faster-programming B-state and C-state storage elements but not to the slower-programming B-state and C-state storage elements.

EXAMPLE 2A

Figure 11H:
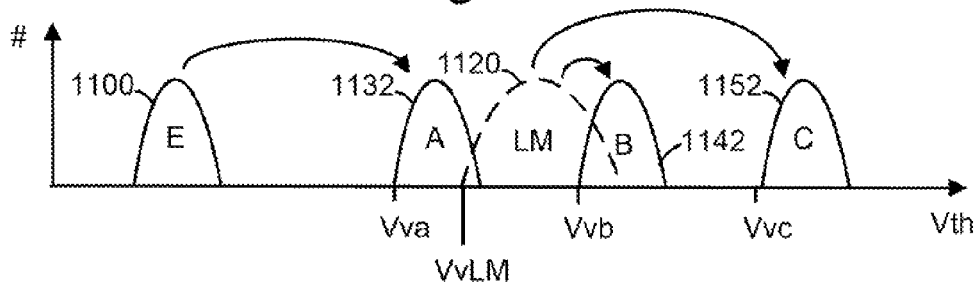
FIG. 11H depicts programming of lower- and upper-state storage elements, following the condition of FIG. 11D, in the second phase of a two-phase programming operation, as an alternative to FIGS. 11F and 11G.

An alternative which is related to Example 2 is discussed next, which involves a two-phase programming operation. FIG. 11H depicts programming of lower- and upper-state storage elements, following the condition of FIG. 11D, in the second phase of a two-phase programming operation, as an alternative to FIGS. 11F and 11G. In this example, the flow from FIG. 11A to 11D corresponds, e.g., to step "1" in FIG. 7A, and the flow in FIG. 11H corresponds to step "3" in FIG. 7A. The programming operation includes the LM-pass and a second pass, which we can call an UP programming pass. This programming operation programs a lower page and then an upper page. This programming operation is faster than three-phase programming operations. In this approach, we only need two extra latches DL1 and DL2. The latch usage is described in FIG. 16C3.

EXAMPLE 3

Another implementation involves the sequence of: 11A-11D, 12A-12C, 11F and 11G. In a first phase, programming speed data is obtained and saved to latches, for higher-state storage elements, and a programming speed-based slow down measure is applied to faster-programming, higher-state storage elements in a remainder of the first phase, and in the entire second and third phases. In a second phase, programming speed data is obtained for lower-state storage elements, and a programming speed-based slow down measure is applied to faster-programming, lower-state storage elements in a remainder of the second phase, and in the entire third phase.

Figure 12A:
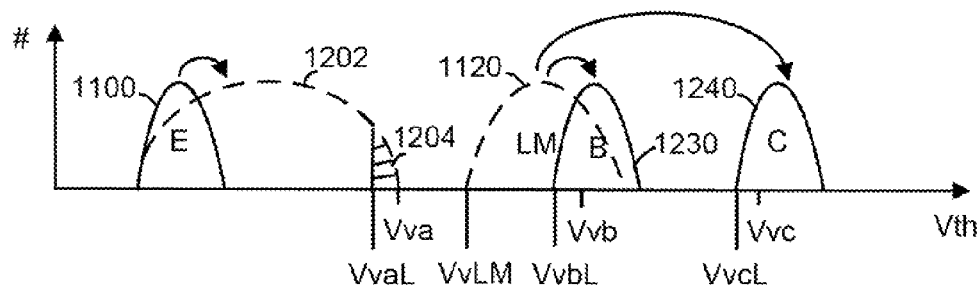
FIG. 12A depicts programming which follows the condition of FIG. 11D, at the start of a first alternative second phase of a three-phase programming operation, in which a minimum number of lower-state storage elements have a Vth>VvaL.
Figure 12B:
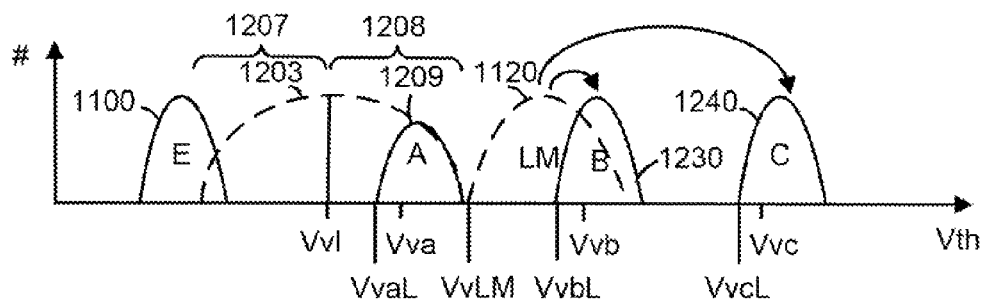
FIG. 12B depicts a condition which follows FIG. 12A, after an additional number of "k" program pulses have been applied, and faster- and slower-programming lower-state storage elements are distinguished using the read level of Vvl, in the second phase of the three-phase programming operation.
Figure 12C:
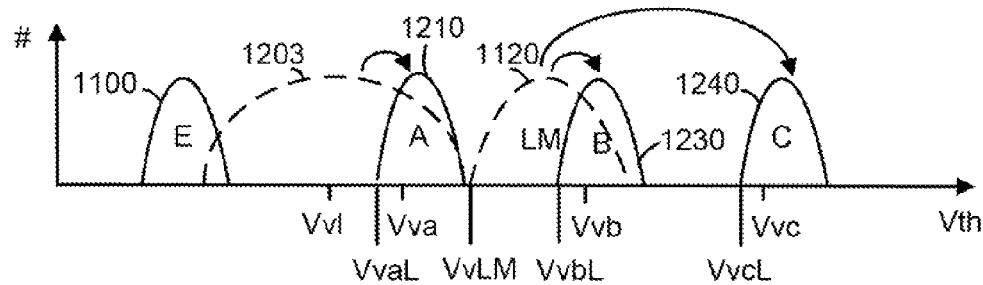
FIG. 12C depicts programming of lower- and upper-state storage elements, following the condition of FIG. 12B, in the first alternative second phase of the three-phase programming operation.

In this example, the flow from FIG. 11A to 11D corresponds, e.g., to step "1" in FIG. 7B, the flow from FIGS. 12A-12C and then to 11F corresponds to step "3" in FIG. 7B, and the flow in FIG. 11G corresponds to step "6" in FIG. 7B. The use of latches is explained in the corresponding steps of FIG. 16D1 or 16D2.

FIG. 12A depicts programming which follows the condition of FIG. 11D, at the start of a first alternative second phase of a three-phase programming operation, in which a minimum number of lower-state storage elements have a Vth>VvAL. The E-state distribution 1100 and the LM distribution 1120 are repeated. As each successive program pulse is applied, the distribution 1100 transitions to the distribution 1202 for A-state storage elements (the lower-state storage elements), and the distribution 1120 transitions to the B-state distribution 1230 and the C-state distribution 1240 for the higher-state storage elements. Based on the program speed data obtained for higher state storage elements during the first phase, a programming speed-based slow down measure can be applied to the faster-programming B- and C-state storage elements.

In the distribution 1202, a region 1204 represents the lower-state storage elements for which Vth>VvaL. Once a minimum number of the lower-state storage elements reach VvaL, a counter is started, and incremented for each additional program pulse. The second phase can use a relatively larger Vpgm step size.

In FIGS. 12A-12C, the Vth transitions for the lower-state storage elements will typically occur before the Vth transitions for the higher-state storage elements.

FIG. 12B depicts a condition which follows FIG. 12A, after an additional number of "k" program pulses have been applied, and faster- and slower-programming lower-state storage elements are distinguished using the read level of Vvl, in the second phase of the three-phase programming operation. Upon completion of the counting of the k additional program pulses, the Vth distribution 1203 includes regions 1207 and 1208 for the slower- and faster-programming storage elements, respectively. The distribution 1209 represents a portion of the A-state storage elements which have been verified to have reached VvaL. Note that the storage elements in distribution 1209 would automatically be the faster storage elements since they reached the target A-state earlier than rest of the storage elements. Vvl is a lower read level because it is used to read the lower state storage elements. A programming speed-based slow down measure continues to be applied to the faster-programming B- and C-state storage elements.

FIG. 12C depicts programming of lower- and upper-state storage elements, following the condition of FIG. 12B, in the first alternative second phase of the three-phase programming operation. At this time, programming speed data is known for both the lower- and higher-state storage elements, so a programming speed-based slow down measure can be applied to the faster-programming A-state storage elements, as well as to the faster-programming B- and C-state storage elements. As programming continues, additional A-state storage elements reach the distribution 1210. The distribution of FIG. 11F can be reached at the end of the second phase, and the third phase can be performed as discussed in connection with FIG. 11G.

EXAMPLE 4

Another implementation involves the sequence of: FIGS. 11A, 13A, 13B1/13C1, 13B2/13C2, 13D and 11G. In a first phase, no programming speed data is obtained. In a second phase, programming speed data is obtained for both lower-state and higher-state storage elements, and a programming speed-based slow down measure is applied to the faster-programming, lower-state and higher-state storage elements in a remainder of the second phase, and in the entire third phase.

In this example, the flow from FIG. 11A to 13A corresponds, e.g., to step "1" in FIG. 7B, the flow from FIG. 13B1/13C1 to 13D corresponds to step "3" in FIG. 7B, and the flow in FIG. 11G corresponds to step "6" in FIG. 7B. The use of latches is explained in the corresponding steps of FIG. 16E.

FIG. 13A depicts the start of a second alternative second phase of a three-phase programming operation, in which a lower intermediate verify level, VvLMx, is used in place of VvLM. The E-state distribution 1100 of FIG. 11A is repeated. This condition is reached at the end of the first phase. A lower LM distribution 1310 is also depicted. If the LM distribution is too close to and/or overlaps with the next higher distribution, which is the lowest state of the higher-states, (the B-state in this case), it will not be possible to reliably detect the relative programming speeds of the higher-state storage elements. As a result, the intermediate verify level (VvLMx) can be moved lower, below the verify level for the lowest target data state of the higher target data states, (the B-state in this case), such that it ensures that the storage elements reach their steady state by the time their Vth begins to reach VvbL. This would make the relative program speed determination more accurate. In order to achieve this, the gap between the VvLMx and VvbL, should typically be an amount which is greater than an expected natural threshold voltage width of the set of non-volatile storage elements. That is, VvbL–VvLMx>natural Vth width. VvLMx denotes a lower verify level than VvLM in previous figures. With VvLMx used in the first phase, the distribution of FIG. 13A, including the intermediate distribution 1310, is achieved.

During the second phase programming, the transition from FIG. 13B1 to FIG. 13B2 would occur first, followed by the transition from FIGS. 13C1 and 13C2, as the lower-state storage elements will reach VvaL earlier than the higher-state storage elements will reach VvbL, in the same programming phase. Similarly the condition of FIG. 13B1 will be reached before the condition of 13C1 can be reached. FIGS. 13B1 and 13C1 are shown separately for clarity. Similarly, FIGS. 13B2 and 13C2 are shown separately for clarity. Programming speed data is obtained for the lower-state storage elements using a read Vvl, and for the higher state storage elements using a read level Vvh. FIGS. 13B1 and 13B2 show a transition involving the lower-state storage elements, and FIGS. 13C1 and 13C2 show a transition involving the higher-state storage elements.

FIG. 13B1 depicts a condition which follows FIG. 13A, in which a minimum number of lower-state storage elements have a Vth>VvAL, in the second alternative second phase of the three-phase programming operation. In the distribution 1302, a region 1304 represents the lower-state storage elements for which Vth>VvaL. Once a minimum number of the lower-state storage elements reach VvaL, a counter is started, and incremented for each additional program pulse. The second phase can use a relatively larger Vpgm step size.

FIG. 13B2 depicts a condition which follows FIG. 13B1, after an additional number of "k1" program pulses have been applied, and faster- and slower-programming lower-state storage elements are distinguished using the read level of Vvl. Upon completion of the counting of the k1 additional program pulses, the Vth distribution 1306 includes regions 1308 and 1310 for the slower- and faster-programming lower-state storage elements, respectively. The distribution 1316 represents a portion of the A-state storage elements which have been verified to have reached VvaL. Note that the storage elements in distribution 1316 would automatically be the faster storage elements since they reached the target A-state earlier than rest of the storage elements. Vvl is the lower read level. No programming speed-based slow down measure has been applied up to the point where the faster- and slower-programming lower-state storage elements are distinguished using the read level of Vvl.

At this point, the programming speed data for the lower-state storage elements (e.g., A-state storage elements) is saved to a data latch. Using the programming speed data in the data latch, a programming speed-based slow down measure can be applied on the lower-state storage elements for a remainder of the phase. The programming can continue while imposing a programming speed-based slow down measure on the faster-programming, lower-state storage elements but not the slower-programming, lower-state storage elements. In general, once the program speed determination has been made for a set of storage elements and saved to the data latches, it is most beneficial to start using the programming speed data during subsequent programming by imposing the slow down measure on the faster-programming storage elements among that set of storage elements. Later on, once the program speed determination is made on the remaining set of storage elements, then the data latches are updated and the slow down measure is imposed on all storage elements for the rest of programming.

FIG. 13C1 depicts a condition which follows FIG. 13A (and would generally follow FIG. 13B2), in which a minimum number of upper-state storage elements have a Vth>VvbL, in the second alternative second phase of the three-phase programming operation. The distribution 1312 is reached by programming the higher-state storage elements from the intermediate (LM) state 1310. In the distribution 1312, a region 1314 represents the higher-state storage elements for which Vth>VvbL. VvbL is a verify level of the lowest state of the higher states. Once a minimum number of the higher-state storage elements reach VvbL, a counter is started, and incremented for each additional program pulse.

FIG. 13C2 depicts a condition which follows FIG. 13C1, after an additional number of "k2" program pulses have been applied, and faster- and slower-programming upper-state storage elements are distinguished using the read level of Vvh, in the second alternative second phase of the three-phase programming operation. Upon completion of the counting of the k2 additional program pulses, the Vth distribution 1322 includes regions 1326 and 1328 for the slower- and faster-programming higher-state storage elements, respectively. The distribution 1324 represents a portion of the B-state storage elements which have been verified to have reached VvbL. Note that the storage elements in distribution 1324 would automatically be the faster storage elements since they reached the target B-state earlier than rest of the storage elements. Vvh is the higher verify level. Note that k1 and k2 indicate that different counters may be used for determining the programming speeds of the lower-state and higher-state storage elements. For simplicity, k1 can be set to same value as k2. Note that regardless of the number of program pulses which are counted, the start of the counting can differ. That is, the conditions of FIGS. 13B1 and 13C1, which trigger the start of the counting, can occur at different times.

FIG. 13D depicts programming of lower- and upper-state storage elements, following the conditions of FIGS. 13C1 and 13C2, in the second alternative second phase of the three-phase programming operation. The lower-state distribution 1306 of FIG. 13B2 and the higher-state distribution 1322 of FIG. 13C2 are repeated. At this time, programming speeds are known for both the lower and higher-state storage elements.

Programming continues such that the lower-state storage elements of the distribution 1306 transition to the A-state distribution 1320, while a programming speed-based slow down measure is imposed on the faster-programming, lower-state storage elements, but not on the slower-programming, lower state storage elements. Similarly, programming continues such that the higher-state storage elements of the distribution 1322 transition to the B-state distribution 1330 and the C-state distribution 1340, while a programming speed-based slow down measure is imposed on the faster-programming, higher-state storage elements, but not on the slower-programming, higher state storage elements.

The third phase of the programming operation is then performed to achieve the condition of FIG. 11G. In this phase, a programming speed-based slow down measure is imposed on the faster-programming, lower-state and higher-state storage elements, but not on the slower-programming, lower state and higher state storage elements.

EXAMPLE 5

Another implementation involves the sequence of: FIGS. 14A, 14B, 14C, 14D, 14E, 14F, 14G, 14H, 14I. In a first phase, programming speed data is obtained for higher-state storage elements, and a programming speed-based slow down measure is applied to faster-programming, higher-state storage elements in a remainder of the first phase, and in the entire second and third phases. In a second phase, programming speed data is obtained for lower-state storage elements, and a programming speed-based slow down measure is applied to faster-programming, lower-state storage elements in a remainder of the second phase, and in the entire third phase.

Figure 14C:
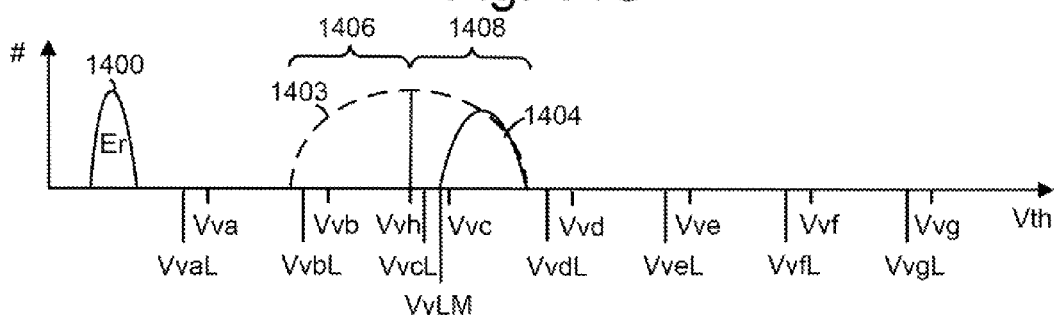
FIG. 14C depicts a condition which follows FIG. 14B, after an additional number of "k" program pulses have been applied, and faster- and slower-programming upper-state storage elements are distinguished using the read level of Vvh, in the first phase of the three-phase programming operation.
Figure 14D:
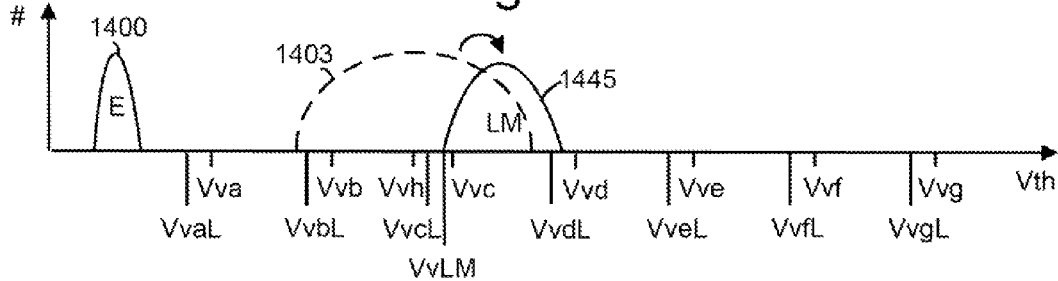
FIG. 14D depicts a condition which follows FIG. 14C, as the first phase of the three-phase programming operation is completed.
Figure 14E:
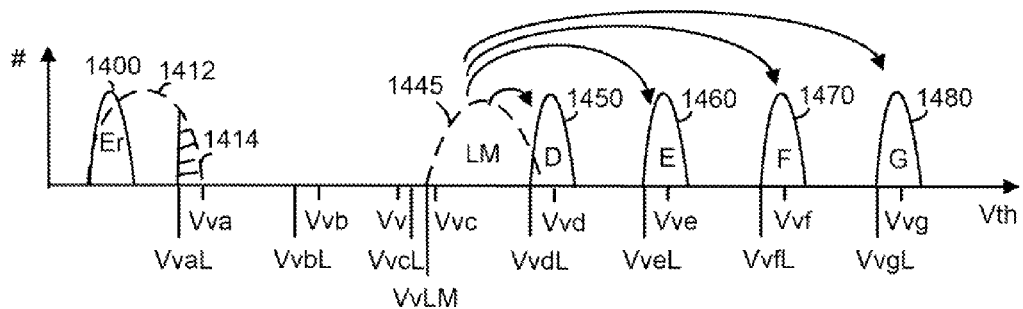
FIG. 14E depicts a condition which follows FIG. 14D, where programming occurs in the second phase of the three-phase programming operation, and a minimum number of lower-state storage elements have a Vth>VvaL.
Figure 14F:
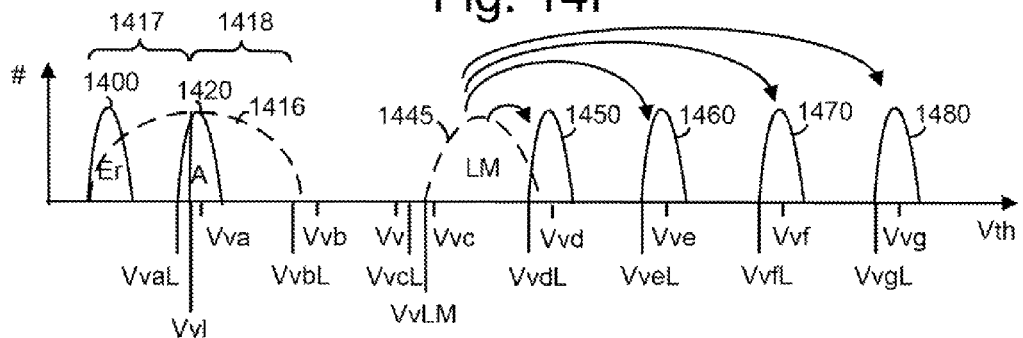
FIG. 14F depicts a condition which follows FIG. 14E, after an additional number of "k" program pulses have been applied, where faster- and slower-programming lower-state storage elements are distinguished using the read level of Vvl, in the second phase of the three-phase programming operation.
Figure 14G:
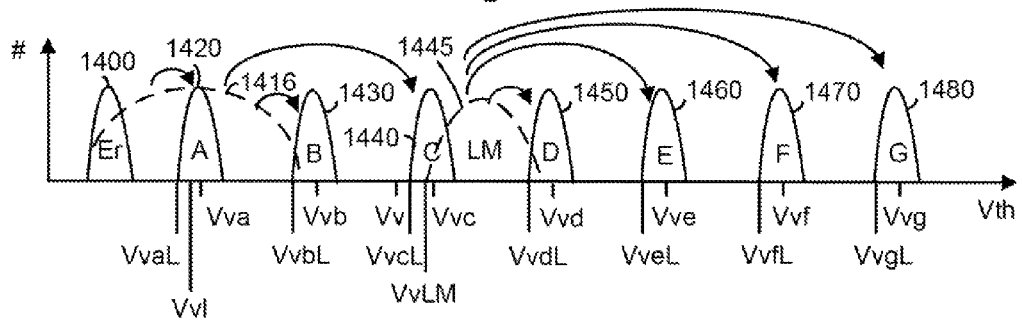
FIG. 14G depicts a condition which follows FIG. 14F, as the second phase of the three-phase programming operation is completed.
Figure 14H:
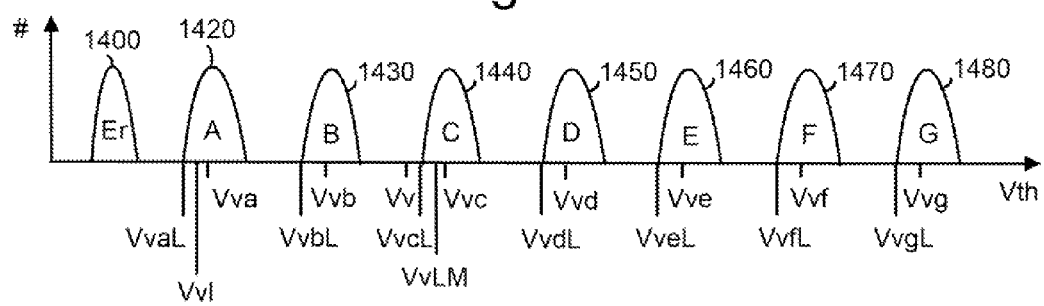
FIG. 14H depicts a condition which follows FIG. 14G, at the start of a third phase of the three-phase programming operation.
Figure 14I:
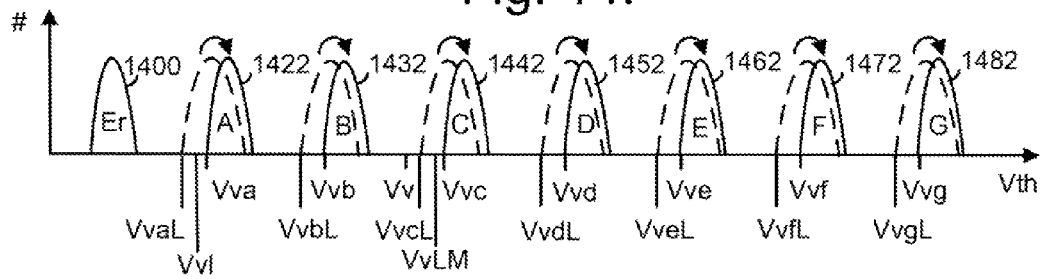
FIG. 14I depicts a condition which follows FIG. 14H, at the end of the third phase of the three-phase programming operation.

In this example, the flow from FIG. 14A to 14D corresponds, e.g., to step "1" in FIG. 7B, the flow from FIG. 14E to 14H corresponds to step "3" in FIG. 7B, and the flow in FIG. 14I corresponds to step "6" in FIG. 7B. The use of latches is explained in the corresponding steps of FIG. 16D1 or 16D2.

FIG. 14A depicts a start of a first phase of a three-phase programming operation in which all storage elements are in the erased state, for an eight-level memory device. The lower states are the erased (Er) state (distribution), and the A-, B- and C-states with lower verify levels VvaL, VvbL and VvcL, respectively, and higher verify levels Vva, Vvb and Vvc, respectively. The higher states are the D-, E-, F- and G-states with lower verify levels VvdL, VveL, VvfL and VvgL, respectively, and higher verify levels, Vvd, Vve, Vvf and Vvg, respectively.

FIG. 14B depicts a condition which follows FIG. 14A, in which a minimum number of upper-state storage elements have a Vth>VvLM, in the first phase of the three-phase programming operation. In the distribution 1402, a region 1404 represents the higher-state storage elements for which Vth>VvaL. Once a minimum number of the lower-state storage elements reach VvLM, a counter is started, and incremented for each additional program pulse.

FIG. 14C depicts a condition which follows FIG. 14B, after an additional number of "k" program pulses have been applied, and faster- and slower-programming upper-state storage elements are distinguished using the read level of Vvh, in the first phase of the three-phase programming operation. Upon completion of the counting of the k additional program pulses, the Vth distribution 1403 includes regions 1406 and 1408 for the slower- and faster-programming higher-state storage elements, respectively. The distribution 1404 represents a portion of the higher-state storage elements which have been verified to have reached VvLM.

FIG. 14D depicts a condition which follows FIG. 14C, as the first phase of the three-phase programming operation is completed. Programming continues from FIG. 11C so that the distribution 1403 (same as 1103) transitions to the distribution 1445 (same as 1120), where all higher-state storage elements have reached the Intermediate (LM) state, at the end of the first phase. At this time, the faster- and slower-programming, higher-state storage elements are known and saved in the latches. Programming from the distribution 1403 to the LM distribution 1445 can be performed for the higher-state storage elements while imposing a programming speed-based slow down measure on the faster-programming, higher-state storage elements but not the slower-programming, higher-state storage elements. This concludes the first phase.

FIG. 14E depicts a condition which follows FIG. 14D, where programming occurs in the second phase of the three-phase programming operation, and a minimum number of lower-state storage elements have a Vth>VvaL. At the start of the second phase, the latches can be read to identify the faster- and slower-programming, higher-state storage elements. The lower-state storage elements are programmed from the erased state distribution 1400 to a distribution 1412, while the upper-state storage elements are programmed from the intermediate distribution 1445 to the D-state distribution 1450, E-state distribution 1460, F-state distribution 1470 and the G-state distribution 1480 according to their respective target states. Note that, in some embodiments of FIGS. 14E-14G, the Vth transitions for the lower-state storage elements will typically occur before the Vth transitions for the higher-state storage elements. Thus, when the A-state storage elements are programmed and their Vth level is increasing, Vpgm is initially high enough only to move the storage elements near A-state Vth. The Vth levels of the higher state store elements may not move during this time. Only when Vpgm gets higher will the Vth of the storage elements near the higher D-, E-, F- and G-states start to increase. Thus, the Vth transitions indicated in FIG. 14E occur in one programming phase, and are shown in one figure for simplicity, but do not necessarily occur at the same time.

Based on the program speed data saved in the latches, for the higher-state storage elements, a programming speed-based slow down measure can be imposed on the faster-programming, higher-state storage elements but not the slower-programming, higher-state storage elements. In the distribution 1412, a region 1414 represents the lower-state storage elements for which Vth>VvaL. Once a minimum number of the lower-state storage elements reach VvaL, a counter is started, and incremented for each additional program pulse. The second phase can use a relatively larger Vpgm step size.

FIG. 14F depicts a condition which follows FIG. 14E, after an additional number of "k" program pulses have been applied, where faster- and slower-programming lower-state storage elements are distinguished using the read level of Vvl, in the second phase of the three-phase programming operation. Upon completion of the counting of the k additional program pulses, the Vth distribution 1416 includes regions 1417 and 1418 for the slower- and faster-programming lower-state programming storage elements, respectively. The distribution 1420 represents a portion of the A-state storage elements which have been verified to have reached VvaL. Note that the storage elements in distribution 1420 would automatically be the faster storage elements since they reached the target A-state earlier than rest of the storage elements.

FIG. 14G depicts a condition which follows FIG. 14F, as the second phase of the three-phase programming operation is completed. At this point, programming speed data is available for the lower-state and higher-state storage elements. The lower-state storage elements are programmed from the distribution 1416 to the A-state distribution 1420, B-state distribution 1430 or the C-state distribution 1440, while a programming speed-based slow down measure is imposed on the faster-programming, lower-state storage elements but not the slower-programming, lower-state storage elements. Similarly, in the second phase, a programming speed-based slow down measure is imposed on the faster-programming, higher-state storage elements but not the slower-programming, higher-state storage elements. The second phase is thus completed.

FIG. 14H depicts a condition which follows FIG. 14G, at the start of a third phase of the three-phase programming operation. A smaller program pulse step size can be used. Note that the Vth distributions can widen due to coupling and interference effects when one or more other word lines are programmed.

FIG. 14I depicts a condition which follows FIG. 14H, at the end of the third phase of the three-phase programming operation. The A-state, B-state, C-state, D-state, E-state, F-state and G-state storage elements are programmed to the distributions 1422, 1432, 1442, 1452, 1462, 1472 and 1482, respectively. A programming speed-based slow down measure can be applied to the faster-programming storage elements but not the slower-programming storage elements.

EXAMPLE 6

Another implementation involves the sequence of: FIGS. 14A, 15A, 15B1/15C1, 15B2/15C2, 15D, 14H, 14I. In a first phase, no programming speed data is obtained. In a second phase, programming speed data is obtained for both lower-state and higher-state storage elements, and a programming speed-based slow down measure is applied to the faster-programming, lower-state and higher-state storage elements in a remainder of the second phase, and in the entire third phase.

FIG. 15A depicts programming in a first phase of an alternative three-phase programming operation in which all storage elements are in the erased state, for an eight-level memory device. The starting point is the distribution of FIG. 14A with the erased (Er) state distribution 1400. The higher-state storage elements are programmed to the intermediate distribution 1545 using VvLM.

The transition from FIGS. 15B1 to 15B2 will typically occur before the transition from FIGS. 15C1 and 15C2. Similarly the condition of FIG. 15B1 will typically occur before the condition of FIG. 15C1. FIGS. 15B1 and 15C1 are shown separately for clarity. Similarly, FIGS. 15B2 and 15C2 are shown separately for clarity. Programming speed data is obtained for the lower-state storage elements using a read level Vvl, and for the higher-state storage elements using a read level Vvh. FIGS. 15B1 and 15B2 show a transition involving the lower-state storage elements, and FIGS. 15C1 and 15C2 show a transition involving the higher-state storage elements.

FIG. 15B1 depicts programming which follows the condition of FIG. 15A, in a second phase of the alternative three-phase programming operation, in which a minimum number of lower-state storage elements have a Vth>VvaL. In the distribution 1502, a region 1504 represents the lower-state storage elements for which Vth>VvaL. Once a minimum number of the lower-state storage elements reach VvaL, a counter is started, and incremented for each additional program pulse. The second phase can use a relatively larger Vpgm step size.

FIG. 15B2 depicts a condition which follows the condition of FIG. 15B1, in the second phase of the alternative three-phase programming operation, after an additional number of "k1" program pulses have been applied, in which faster- and slower-programming lower-state storage elements are distinguished using the read level of Vvl. Upon completion of the counting of the k1 additional program pulses, the Vth distribution 1506 includes regions 1507 and 1508 for the slower and faster-programming lower-state storage elements, respectively. The distribution 1520 represents a portion of the A-state storage elements which have been verified to have reached VvaL. Note that the storage elements in distribution 1520 would automatically be the faster storage elements since they reached the target A-state earlier than rest of the storage elements. Vvl is the lower read level. No programming speed-based slow down measure has yet been applied up to the point where the faster- and slower-programming lower-state storage elements are distinguished using the read level of Vvl. At this point the programming speed data for the lower-state storage elements (e.g., A-state storage elements) is saved to a data latch. Using the programming speed data in the data latch, a programming speed-based slow down measure can be applied on the lower-state storage elements for a remainder of the phase. The programming can continue while imposing a programming speed-based slow down measure on the faster-programming, lower-state storage elements but not the slower-programming, lower-state storage elements.

FIG. 15C1 depicts programming which follows the condition of FIG. 15A, in the second phase of the alternative three-phase programming operation, in which a minimum number of upper-state storage elements have a Vth>VvdL. The distribution 1543 is reached by programming the higher-state storage elements from the intermediate (LM) state 1542. In the distribution 1543, a region 1544 represents the higher-state storage elements for which Vth>VvdL. VvdL is a verify level of the lowest state of the higher states. It is possible to use another verify level. Once a minimum number of the higher-state storage elements reach VvdL, a counter is started, and incremented for each additional program pulse.

FIG. 15C2 depicts a condition which follows the condition of FIG. 15C1, in the second phase of the alternative three-phase programming operation, after an additional number of "k2" program pulses have been applied, in which faster- and slower-programming upper-state storage elements are distinguished using the read level of Vvh. Upon completion of the counting of the k2 additional program pulses, the Vth distribution 1548 includes regions 1545 and 1546 for the slower- and faster-programming higher-state storage elements, respectively. The distribution 1547 represents a portion of the D-state storage elements which have been verified to have reached VvdL. Note that the storage elements in distribution 1547 would automatically be the faster storage elements since they reached the target D-state earlier than rest of the storage elements. Vvh is the higher read level. Note that k1 and k2 indicate that different counters may be used for determining the programming speeds of the lower-state and higher-state storage elements. For simplicity, k1 can be set to same value as k2. Note that regardless of the number of program pulses which are counted, the start of the counting can differ. That is, the conditions of FIGS. 15B1 and 15C1, which trigger the start of the counting, can occur at different times.

Figure 15D:
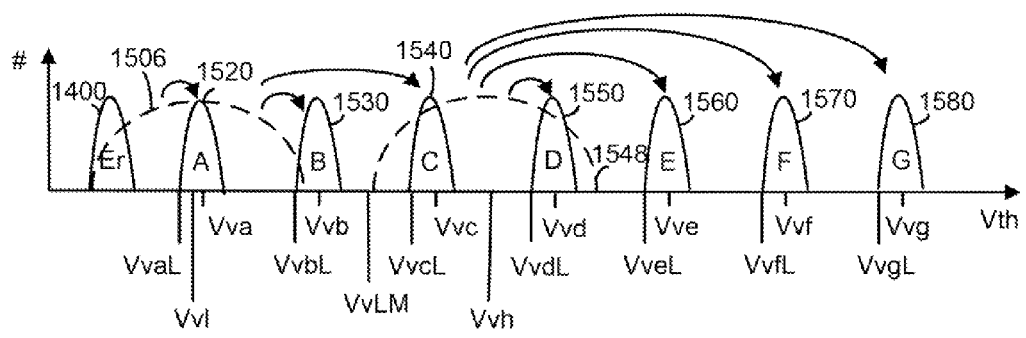
FIG. 15D depicts programming which follows the conditions of FIG. 15B2 and FIG. 15C2, in which the second phase of the alternative three-phase programming operation is completed.

FIG. 15D depicts programming which follows the conditions of FIG. 15C1 and FIG. 15C2, in which the second phase of the alternative three-phase programming operation is completed. The lower-state distribution 1506 of FIG. 15B2 and the higher-state distribution 1548 of FIG. 15C2 are repeated. At this time, programming speeds are known for both the lower- and higher-state storage elements. Programming continues such that the lower-state storage elements of the distribution 1506 transition to the A-state distribution 1520, B-state distribution 1530 or C-state distribution 1540, while a programming speed-based slow down measure is imposed on the faster-programming, lower-state storage elements, but not on the slower-programming, lower state storage elements. Similarly, programming continues such that the higher-state storage elements of the distribution 1548 transition to the D-state distribution 1550, the E-state distribution 1560, the F-state distribution 1570, and the G-state distribution 1580, while a programming speed-based slow down measure is imposed on the faster-programming, higher-state storage elements, but not on the slower-programming, higher state storage elements.

Note that, in some embodiments of FIG. 15D, the Vth transitions for the lower-state storage elements will typically occur before the Vth transitions for the higher-state storage elements.

Figure 15E:
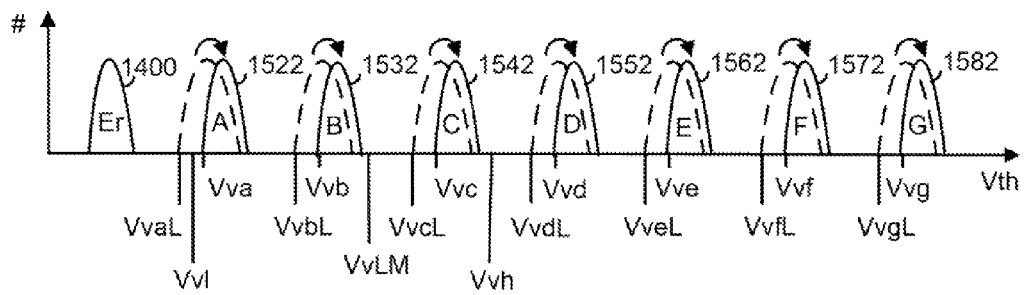
FIG. 15E depicts programming which follows the condition of FIG. 15D, in which the third phase of the alternative three-phase programming operation is completed.

FIG. 15E depicts programming which follows the condition of FIG. 15D, in which the third phase of the alternative three-phase programming operation is completed. In this phase, a programming speed-based slow down measure is imposed on the faster-programming, lower-state and higher-state storage elements, but not on the slower-programming, lower state and higher state storage elements. Transitions are made to the A-state distribution 1522, the B-state distribution 1532, the C-state distribution 1542, the D-state distribution 1552, the E-state distribution 1562, the F-state distribution 1572 and the G-state distribution 1582 using the verify levels Vva, Vvb, Vvc, Vvd, Vve, Vvf and Vvg, respectively.

Note that the Vth distributions at the lower verify levels can widen due to coupling and interference effects when one or more other word lines are programmed.

FIG. 16A1 depicts data latches for respective bit lines for use in a multi-phase programming operation, for two-bit storage elements. Example bit lines BLi−2, BLi−1, BLi, BLi+1 and BLi+2 are depicted. In a four-level, two-bit per storage element embodiment, a first set of latches (LDL) 1600, a second set of latches (UDL) 1610, a third set of latches (DL1) 1620, a fourth set of latches (DL2) 1630, and a fifth set of data latches (DL3) 1640 are provided. In some cases, not all latches are needed. The latches associated with one bit line are shared by different storage elements of the bit line. When a multi-phase programming operation is performed in which a back-and-forth word line order is used, care is needed to maintain information in the latches. During programming, the LDL and UDL are used to store the user data that needs to be programmed, while the DL1, DL2 and DL3 latches can be used to store programming speed data.

FIG. 16A2 depicts data latches for respective bit lines for use in a multi-phase programming operation, for three-bit storage elements. In this case, a set of latches (UDL1) 1612 stores a lower, upper page bit (i.e., a middle page bit), and a set of latches (UDL2) 1614 stores an upper, upper page bit.

In FIGS. 16B-16E, the use of latches is depicted, consistent with the previous examples, including Examples 1-5 discussed in connection with FIGS. 10A-15E. The notation "w" indicates that programming speed data is written (e.g., stored) to latches in the programming phase, "r" indicates that programming speed data is read from the latches (prior to each program pulse) in the programming phase and used to impose a slow down measure in the programming phase, "m" indicates that the programming speed data is maintained in the latches and is not written or read in the programming phase (such as when another word line is being programmed), "rst" indicates that the latches are reset at the end of the programming phase, and "x" indicates that no programming speed data is stored in the latch which means the latch is empty and usable for some other data storage or some other purpose. For example, the notation "WLn high/low (r,rst/w,r,rst)" in FIG. 16D2, at step 3, indicates that the corresponding programming phase involves reading programming speed data from latches which are associated with storage elements of WLn which have high target data states, initially. Later, within the programming phase, the program speed information is acquired for storage elements belonging to low target data states and a write operation is performed on the data latch to update the latch with this information. For the following program pulses, the data latch is read to obtain program speed information of storage elements belonging to both high and low target data states. Finally, at the end of programming phase, the latches are reset.

Also in FIGS. 16B-16E, each step corresponds to a programming phase on a particular WL indicated in the figure.

FIG. 16B depicts data stored in data latches for Example 1. "Step" refers to the step number indicated in FIG. 7A. In step 1, lower and upper page data for WLn can be stored in latches such as LDL and UDL, for instance, and/or cached, depending on the type of programming used. Specific details regarding the storage of the upper and lower paged of data is not provided as any appropriate technique can be used. Programming speed data is written in DL1 for all states for WLn, and read on every subsequent program pulse. In step 2, programming speed data is written in DL2 for all states for WLn+1, and read on every subsequent program pulse. During this time data in DL1 is simply maintained. Step 3 does not change the latch data, and DL1 is read prior to each program pulse, and reset at the end of the programming phase. In step 4, DL1 is written with programming speed data for all states for WLn+2, and read on each subsequent program pulses. In step 5, DL2 is read prior to each program pulse, to obtain the programming speed data for all states for WLn+1. At the end of step 5, WLn+1 finishes programming and hence program speed information for storage elements belonging to WLn+2 is no longer required. Thus, DL2 is reset at the end of programming WLn+2. The programming speed data is applied to the storage elements as soon as the data is determined or read.

FIG. 16C1 depicts data stored in data latches for Example 2. The step refers to the step number indicated in FIG. 7B. In step 1, programming speed data is written in DL1 for the higher states for WLn, and read on every subsequent program pulse. In step 2, programming speed data is written in DL2 for the higher states for WLn+1, and read on every subsequent program pulse. Step 3 does not change the latch data, and DL1 is read prior to each program pulse, to obtain the programming speed data for the higher states for WLn. In step 4, programming speed data is written in DL3 for the higher states for WLn+2, and read on every subsequent program pulse. In step 5, DL2 is read prior to each program pulse, to obtain the programming speed data for the higher states for WLn+1. In step 6, DL1 is read prior to each program pulse, to obtain the programming speed data for the higher states for WLn. At the end of step 6, WLn finishes programming and hence DL1 is reset. In step 7, programming speed data is written in DL1 for the higher states for WLn+3, and read on every subsequent program pulse. In step 8, DL3 is read prior to each program pulse, to obtain the programming speed data for the higher states for WLn+2. In step 9, DL2 is read prior to each program pulse, to obtain the programming speed data for the higher states for WLn+1. At the end of step 9, WLn+1 finishes programming and hence DL2 is reset.

FIG. 16C2 depicts an alternative to FIG. 16C1 in which, the slow down measure based on programming speed data is not applied in the third phase. In this case, DL3 is not needed. A difference from FIG. 16C1 is that: in step 4, programming speed data is written in DL1 (instead of DL3) for the higher states for WLn+2 and, in step 7, the programming speed data is written in DL2 (instead of DL1) for the higher states for WLn+3. Also, at the end of step 8, DL1 can be reset since the programming speed data for WLn+2 is no longer needed. Similarly, DL1 and DL2 can be reset earlier, at the end of step 3 and step 5 respectively.

FIG. 16C3 depicts data stored in data latches for Example 2A. "Step" refers to the step number indicated in FIG. 7A. In step 1, programming speed data is written in DL1 for the higher-state storage elements for WLn, and read on every subsequent program pulse. In step 2, programming speed data is written in DL2 for the higher-state storage elements for WLn+1, and read on every subsequent program pulse. Step 3 does not change the latch data, and DL1 is read prior to each program pulse, to obtain the programming speed data for the higher states for WLn. At the end of step 3, WLn finishes programming and hence DL1 is reset. In step 4, programming speed data is written in DL1 for the higher-state storage elements for WLn+2, and read on every subsequent program pulse. In step 5, DL2 is read prior to each program pulse, to obtain the programming speed data for the higher states for WLn+1. At the end of step 5, WLn+1 finishes programming and hence DL2 is reset.

FIG. 16D1 depicts data stored in data latches for Example 3 or 5. "Step" refers to the step number indicated in FIG. 7B. In step 1, programming speed data is written in DL1 for the higher states for WLn, and read on every subsequent program pulse. In step 2, programming speed data is written in DL2 for the higher states for WLn+1, and read on every subsequent program pulse. In step 3, programming speed data is written in DL1 for the lower states for WLn, and prior to each program pulse DL1 is read, to obtain the programming speed data for the higher states for WLn, initially in the programming phase, and later on, for both higher and lower states for WLn. In step 4, programming speed data is written in DL3 for the higher states for WLn+2, and read on every subsequent program pulse. In step 5, programming speed data is written in DL2 for the lower states for WLn+1, and prior to each program pulse DL2 is read to obtain the programming speed data for the higher states for WLn+1, initially in the programming phase, and later on, for both higher and lower states for WLn+1. In step 6, DL1 is read prior to each program pulse, to obtain the programming speed data for the higher and lower states for WLn. At the end of step 6, WLn finishes programming and hence DL1 is reset. In step 7, programming speed data is written in DL1 for the lower states for WLn+3, and read on every subsequent program pulse. In step 8, programming speed data is written in DL3 for the lower states for WLn+2, and prior to each program pulse DL3 is read to obtain the programming speed data for the WLn+2 high states, initially in the programming phase, and later on, for both higher and lower states for WLn+2. In step 9, DL2 is read prior to each program pulse to obtain the programming speed data for the higher and lower states for WLn+1. At the end of step 9, WLn+1 finished programming and hence DL2 is reset.

FIG. 16D2 depicts an alternative to FIG. 16D1 in which the slow down measure based on programming speed data is not applied in the third phase. In this case, DL3 is not needed. A difference from FIG. 16D1 is that: in step 4, programming speed data is written in DL1 (instead of DL3) for the higher states for WLn+2, and, in step 7, the programming speed data is written in DL2 (instead of DL1) for the higher states for WLn+3. Also, at the end of step 5, DL2 can be reset since the programming speed data for WLn+1 is no longer needed, and, at the end of step 8, DL1 can be reset since the programming speed data for WLn+2 is no longer needed. Similarly, DL1 can be reset earlier, at the end of step 3 since the program speed data for WLn is no longer needed.

FIG. 16E depicts data stored in data latches for Example 4 or 6. "Step" refers to the step number indicated in FIG. 7B. Steps 1 and 2 do not involve writing or reading any programming speed data. In step 3, programming speed data is written in DL1 for the lower states at first and later for the higher states for WLn, and DL1 is read on every subsequent program pulse. In step 4, the programming speed data in DL1 is maintained. In step 5, programming speed data is written in DL2 for the lower states at first and later for the higher states for WLn+1, and DL2 is read on every subsequent program pulse. In step 6, DL1 is read prior to each program pulse, to obtain the programming speed data for the lower and higher states for WLn. At the end of step 6, DL1 can be reset because the programming speed data for WLn is no longer needed since all programming of WLn has been completed. Generally, a latch which stores programming speed data for a word line can be reset when that word line completes programming or otherwise no longer needs the programming speed data. In step 7, the programming speed data in DL2 is maintained. In step 8, programming speed data is written in DL1 for the lower states at first and later for the higher states for WLn+2, and DL1 is read on every subsequent program pulse. In step 9, DL2 is read prior to each program pulse, to obtain the programming speed data for the lower and higher states for WLn+1. At the end of step 9, WLn+1 finishes programming and hence DL2 is reset.

In Example 4 and FIG. 16E, note that the following steps are performed for the latches.

Step 1: Start of programming

Step 3 includes different parts 3a-3d.

Part 3a: Acquire the programming speed data for lower-state storage elements. This information is saved into the latches (DL1 in this example). This is one write operation.

Part 3b: Read the programming speed data from the latches prior to each program pulse in the subsequent programming, and based on the information read; apply a slow down measure on the faster storage elements of lower-state, for subsequent programming. This is a read operation.

Part 3c: Later on, in the same programming phase, acquire the programming speed data for the higher-state storage elements. This information is added to the same set of latches (DL1) and hence the latches are updated. Now we have consolidated programming speed data for all storage elements. This is another write operation.

Part 3d: Read the programming speed data from the latches prior to each program pulse in the subsequent programming, and based on the information read, apply a slow down measure on the faster storage elements of lower- and higher-state storage elements, for subsequent programming. This is a read operation.

Step 6 includes parts 6a and 6b.

Part 6a: Read the programming speed data from the latches prior to each program pulse in the programming phase, and based on the information read, apply a slow down measure on the faster storage elements of lower- and higher-state storage elements, for subsequent programming. This is a read operation.

Part 6b: Reset the latches at the end of the multi-phase programming operation for WLn.

The following describes an option to discard programming speed data in a last programming phase.

As mentioned in connection with FIGS. 16C2 and 16D2, it is possible to discard programming speed data in a last programming phase, such as the third phase of a three-phase programming operation, to reduce the number of latches, e.g., by one latch per bit line. In this case, the programming speed data is applied in one or more earlier programming phases before the last phase. In many cases, this still results in a significant benefit.

Moreover, the level of Vsgd can be higher in an earlier program phase such as the second phase, than in the last phase. This can be helpful in that a higher bit line bias can be used when Vsgd is higher, and Vsgd is optimally tailored to the current conditions so that unnecessary stress on the SGD transistor is avoided and power consumption is reduced. For example, the earlier phase can use an additional bit line bias, which is not based on programming speed, but which is applied, e.g., when the Vth of a storage element is between the lower and upper verify levels of the target data states, or throughout a programming phase, or at other times. This is an additional slow down measure which can be implemented in addition to a programming speed-based slow down measure.

Referring to FIG. 10A, for instance, for a storage element with a target state of the A-state, the additional bit line bias can be applied when the Vth of a storage element is between VvaL and Vva. The additional bit line bias is added to the programming speed-based bias which is applied to the faster-programming storage elements. For the slower-programming storage elements, only the additional bit line bias is used. For example, the programming speed-based bias may be 0.7 V, and the additional bit line bias may be 0.5 V. Thus, a bit line bias of 0.5 V can be applied to the slower-programming storage elements, and a bit line bias of 1.2 V can be applied to the faster-programming storage elements. The bit lines biases are applied to bit lines which are not yet locked out. A lockout bit line bias may be 2-3 V. Subsequently, in the final phase, the programming speed-based bias is not used, but the additional bit line bias is used. For example, a bit line bias of 0.5 V can be applied to the programmed storage elements. By adjusting the level of Vsgd in the different phases, the performance of the memory device can be optimized.

The Vbl cannot be made too high, as it is limited by the Vsgd (drain-side select gate) margin-window. If Vbl is too high, then the Vsgd level needed to turn on, or make conductive, the drain-side select gate, would be excessively high. Specifically, the Vsgd level which is sufficiently high for a selected NAND string to pass a high Vbl could be excessively high for an unselected, inhibited NAND string to keep the drain-side select gate in a non-conductive state. However, a common Vsgd is used for all bit lines, both selected and unselected.

Keeping the drain-side select gate in a non-conductive state is desirable for an unselected bit line and NAND string because it allows a channel in the substrate of the unselected NAND string to maintain a boost level which inhibits programming of the unselected storage elements of the unselected NAND string during programming of a selected NAND string. If the drain-side select gate becomes conductive, the boost potential in the inhibited channel would leak away, which can lead to program disturb on the inhibited storage element. The Vsgd level which is sufficiently high to pass Vbl is (a) Vsgd$\geq$Vbl+Vth(sgd)+margin, where Vth(sgd) is the threshold voltage of the SGD transistor and margin is some additional small safety margin. On the other hand, the Vsgd level which is sufficiently low to cutoff the channel and not pass Vbl is (b) Vsgd$\leq$Vbl+Vth(sgd)−margin. Condition (a) should be met for a selected bit line, and condition (b) should be met for an unselected bit line. The combination of the two conditions leads to a Vsgd margin window within which the Vsgd value should be set to have optimum programming.

For instance, assume Vth(sgd)=1 V and margin=0.2 V. In an earlier programming phase, we apply the programming speed-based bias of 0.7 V and the additional bit line bias of 0.5 V. For a selected bit line with Vbl=1.2 V, condition (a) is: Vsgd≧1.2 V+1 V+0.2 V, or Vsgd≧2.4 V. Condition (b) is Vsgd≦Vbl+1 V−0.2 V, or Vsgd≦Vbl+0.8 V. With Vsgd=2.4 V for the selected bit lines, for instance, condition (a) is met, and condition (b) is met if Vbl≧1.6 for the unselected bit lines. These conditions are reasonable because the Vsgd is not excessively high.

In the final programming phase, we apply the additional bit line bias of 0.5 V but not the programming speed-based bias of 0.7 V. For a selected bit line with Vbl=0.5 V, condition (a) is: Vsgd≧0.5 V+1 V+0.2 V, or Vsgd≧1.7 V. Condition (b) is Vsgd≦Vbl+1 V−0.2 V, or Vsgd≦Vbl+0.8 V. With Vsgd=1.7 V for the selected bit lines, for instance, condition (a) is met, and condition (b) is met if Vbl≧1.0 for the unselected bit lines. Again, these conditions are reasonable because the Vsgd is not excessively high, and is no higher than is necessary, so that unnecessary stress on the SGD transistor is avoided. Similarly, power consumption is reduced.

The bit line bias values discussed are examples only.

This technique can therefore include performing one phase, such as the foggy phase, of a multi-phase programming operation, including: (a) distinguishing faster-programming non-volatile storage elements from slower-programming non-volatile storage elements, and (b) responsive to the distinguishing: (i) continuing programming of at least some of the faster-programming non-volatile storage elements, while setting an associated bit line voltage to a first non-zero bit line level (e.g., the sum of the programming speed-based bias of 0.7 V and the additional bit line bias of 0.5 V) to impose a slow down measure, (ii) continuing programming of at least some of the slower-programming non-volatile storage elements, while setting an associated bit line voltage to a second non-zero bit line level (e.g., the additional bit line bias of 0.5 V) which is less than the first non-zero bit line level, and (iii) setting a common control gate voltage of drain side select gates associated with the non-volatile storage elements at a first control gate level (e.g., 2.4 V). The technique further includes raising an associated bit line voltage to a lockout level (e.g., 2.5-3 V), which is greater than the first bit line level, for the at least some of the faster-programming non-volatile storage elements and the at least some of the slower-programming non-volatile storage elements which reach an associated verify level in the one phase.

The technique further includes subsequently performing a next phase, such as the fine phase, of the multi-phase programming operation, including continuing programming of the faster and slower non-volatile storage elements while setting associated bit line voltages to a non-zero level (e.g., the additional bit line bias of 0.5 V) which is less than the first bit line level, and setting the common control gate voltage of the select gates at a second control gate level (e.g., 1.7 V), below the first control gate level. The technique further includes raising an associated bit line voltage to the lockout level for the at least some of the faster-programming non-volatile storage elements and the at least some of the slower-programming non-volatile storage elements which reach an associated verify level in the next phase.

Figure 17:
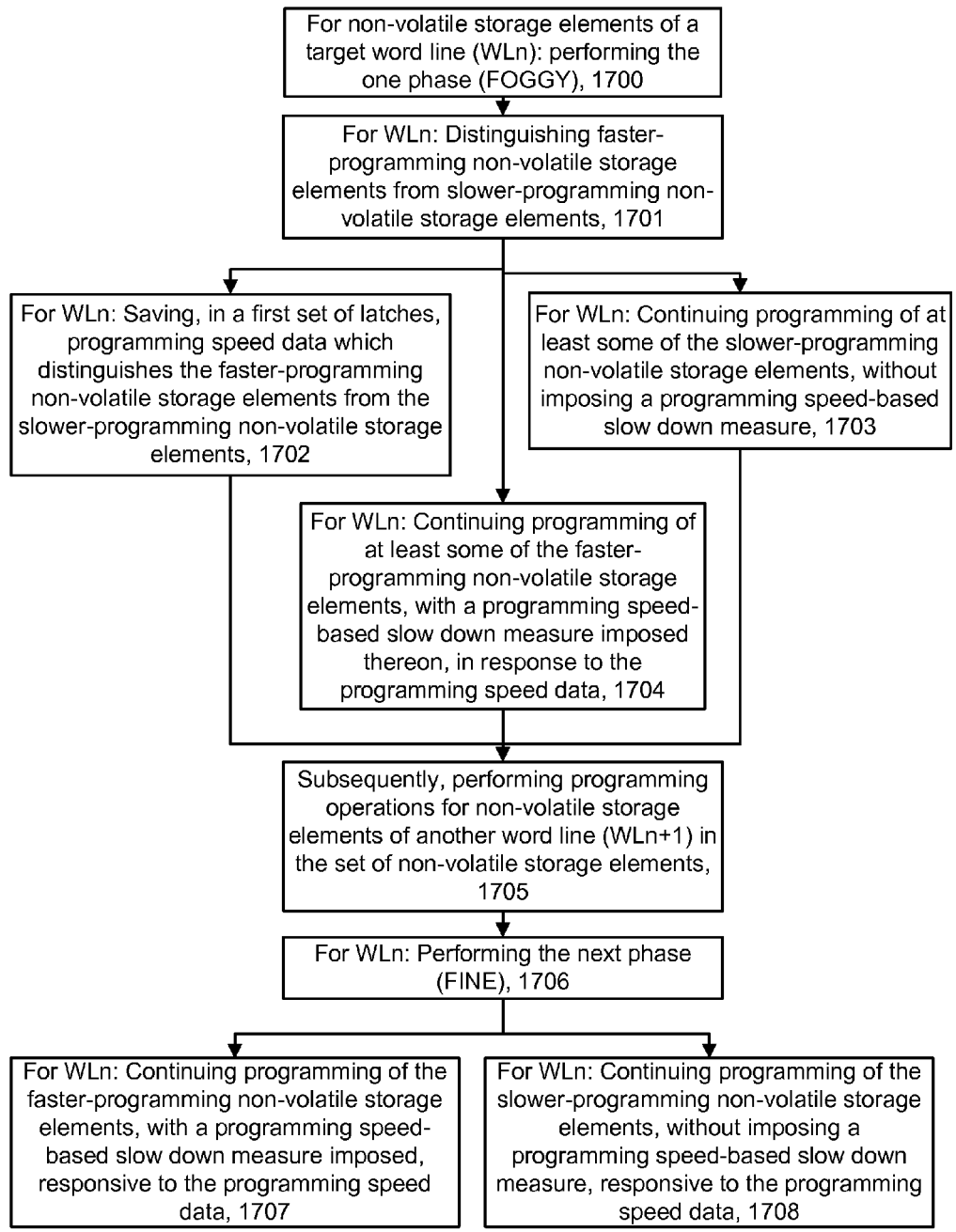
FIG. 17 depicts a method is provided for programming a set of non-volatile storage elements using a multi-phase programming operation which includes one phase (FOGGY) and a next phase (FINE).

As depicted in FIG. 17, in one embodiment, a method is provided for programming a set of non-volatile storage elements using a multi-phase programming operation which includes one phase (FOGGY) and a next phase (FINE). The method includes, for non-volatile storage elements of a target word line (WLn) (step 1700): performing the one phase (FOGGY), including (a) distinguishing faster-programming non-volatile storage elements of the target word line from slower-programming non-volatile storage elements of the target word line (step 1701). The method further includes, (b) responsive to the distinguishing: (i) saving, in a first set of latches, programming speed data which distinguishes the faster-programming non-volatile storage elements of the target word line from the slower-programming non-volatile storage elements of the target word line (step 1702), (ii) reading the first set of latches before each subsequent program pulse and, based on the information read, (iii) continuing programming of at least some of the faster-programming non-volatile storage elements of the target word line, with a programming speed-based slow down measure imposed thereon (step 1704), and (iv) continuing programming of at least some of the slower-programming non-volatile storage elements of the target word line, without imposing a programming speed-based slow down measure (step 1703).

The method further includes subsequently, performing programming operations for non-volatile storage elements of another word line (WLn+1) in the set of non-volatile storage elements (step 1705). The method further includes, during the next phase (FINE) (step 1706): continuing programming of the faster-programming non-volatile storage elements of the target word line, with a programming speed-based slow down measure imposed, responsive to the programming speed data in the first set of latches (step 1707), and continuing programming of the slower-programming non-volatile storage elements of the target word line, without a programming speed-based slow down measure imposed, responsive to the programming speed data in the first set of latches (step 1708).

A corresponding non-volatile storage apparatus includes a set of non-volatile storage elements, word lines associated with the set of non-volatile storage elements, including a target word line, and one or more control circuits. The one or more control circuits perform the above-mentioned method steps. Or, the apparatus can include means for performing the above-mentioned method steps.

In another embodiment, a method is provided for programming a set of non-volatile storage elements using a multi-phase programming operation which includes one phase (LM), a next phase (FOGGY), and a next, next phase (FINE). The method includes, for non-volatile storage elements of a target word line in the set of non-volatile storage elements: performing the one phase (LM), including: programming non-volatile storage elements having higher target data states (B, C; D, E, F, G) from an erased state to an intermediate distribution having an intermediate verify level (VvLM) which is below verify levels of the higher target data states, while non-volatile storage elements which have at least one lower target data state (A; A, B, C) remain in the erased state. The method further includes performing the next phase (FOGGY) using a first set of verify levels (VvaL, VvbL, VvcL; VvaL, VvbL, VvcL, VvdL, VveL, VvfL, VvgL), including: (a) distinguishing faster-programming non-volatile storage elements from slower-programming non-volatile storage elements, among the non-volatile storage elements which have the at least one lower target data state, (b) responsive to the distinguishing: (i) saving, in a first set of latches, programming speed data which distinguishes the faster-programming non-volatile storage elements which have the at least one lower target data state from the slower-programming non-volatile storage elements which have the at least one lower target data state, (ii) reading the first set of latches before each subsequent program pulse and based on the information read, (iii) continuing programming of at least some of the faster-programming non-volatile storage elements which have the at least one lower target data state, with a programming speed-based slow down measure imposed thereon, and (iv) continuing programming of at least some of the slower-programming non-volatile storage elements which have the at least one lower target data state, without imposing a programming speed-based slow down measure, and (c) continuing programming of the non-volatile storage elements which have the higher target data states.

The method further includes performing the next, next phase (FINE) using associated verify levels of a second set of verify levels (Vva, Vvb, Vvc; Vva, Vvb, Vvc, Vvd, Vve, Vvf, Vvg), where each verify level in the second set of verify levels is higher than a corresponding verify level in the first set of verify levels, including: (d) reading the first set of latches before each program pulse and based on the information read, continuing programming of the faster-programming non-volatile storage elements which have the at least one lower target data state, with a programming speed-based slow down measure imposed thereon which is responsive to the programming speed data in the first set of latches, and continuing programming of the slower-programming non-volatile storage elements which have the at least one lower target data state, without imposing a programming speed-based slow down measure, and (e) continuing programming of the non-volatile storage elements which have the higher target data states.

A corresponding non-volatile storage apparatus includes a set of non-volatile storage elements, word lines associated with the set of non-volatile storage elements, including a target word line, and one or more control circuits. The one or more control circuits perform the above-mentioned method steps. Or, the apparatus can include means for performing the above-mentioned method steps.

In another embodiment, a method is provided for programming a set of non-volatile storage elements using a multi-phase programming operation which includes one phase (FOGGY) and a next phase (FINE). The method includes, for non-volatile storage elements of a target word line in the set of non-volatile storage elements: performing the one phase (FOGGY), including: (a) distinguishing faster-programming non-volatile storage elements from slower-programming non-volatile storage elements, and (b) responsive to the distinguishing: (i) saving, in a first set of latches, programming speed data which distinguishes the faster-programming non-volatile storage elements of the target word line from the slower-programming non-volatile storage elements of the target word line, (ii) reading the first set of latches before each program pulse and based on the information read, (iii) continuing programming of at least some of the faster-programming non-volatile storage elements, while setting an associated bit line voltage to a first non-zero bit line level (e.g., 1.2 V) to impose a programming speed-based slow down measure, (iv) continuing programming of at least some of the slower-programming non-volatile storage elements, while setting an associated bit line voltage to a second non-zero bit line level (0.5V) which is less than the first non-zero bit line level, and (iii) setting a common control gate voltage of drain side select gates associated with the non-volatile storage elements at a first control gate level (e.g., 2.4 V).

The method further includes raising an associated bit line voltage to a lockout level, which is greater than the first bit line level, for the at least some of the faster-programming non-volatile storage elements and the at least some of the slower-programming non-volatile storage elements which reach an associated verify level in the one phase. The method further includes subsequently performing the next phase (FINE), including continuing programming of the faster and slower non-volatile storage elements while reading the first set of latches before each program pulse and, based on the information read, setting associated bit line voltages to a non-zero level which is less than the first bit line level, and setting the common control gate voltage of the select gates at a second control gate level (e.g., 1.7), below the first control gate level.

The method further includes raising an associated bit line voltage to the lockout level for the at least some of the faster-programming non-volatile storage elements and the at least some of the slower-programming non-volatile storage elements which reach an associated verify level in the next phase.

A corresponding non-volatile storage apparatus includes a set of non-volatile storage elements, word lines associated with the set of non-volatile storage elements, including a target word line, and one or more control circuits. The one or more control circuits perform the above-mentioned method steps. Or, the apparatus can include means for performing the above-mentioned method steps.

In another embodiment, a method is provided for programming non-volatile storage elements of a target word line in a set of non-volatile storage elements. The method includes: (a) applying programming pulses to the target word line, (b) determining when a specified number of the non-volatile storage elements reach a defined verify level (VvaL, Vva), (c) counting a number (m, k) of the programming pulses after the specified number of the non-volatile storage elements reach the first verify level, (d) in response to completion of the counting, distinguishing faster-programming non-volatile storage elements from slower-programming non-volatile storage elements by performing a sensing operation done at the defined level (VvaL, Vva) or another lower level (Vvl), (e) responsive to the distinguishing, saving, in a first set of latches, programming speed data which distinguishes the faster-programming non-volatile storage elements of the target word line from the slower-programming non-volatile storage elements of the target word line, and (f) reading the first set of latches before each program pulse and, based on the information read, continuing programming of at least some of the faster-programming non-volatile storage elements of the target word line, with an associated programming speed-based slow down measure imposed thereon, and continuing programming of at least some of the slower-programming non-volatile storage elements of the target word line without imposing a programming speed-based slow down measure.

A corresponding non-volatile storage apparatus includes a set of non-volatile storage elements, word lines associated with the set of non-volatile storage elements, including a target word line, and one or more control circuits. The one or more control circuits perform the above-mentioned method steps. Or, the apparatus can include means for performing the above-mentioned method steps.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

We claim:

1. A method for programming a set of non-volatile storage elements using a multi-phase programming operation which includes one phase and a next phase, the method comprising:
for non-volatile storage elements of a target word line:
performing the one phase, including (a) distinguishing faster-programming non-volatile storage elements of the target word line from slower-programming non-volatile storage elements of the target word line, and (b) responsive to the distinguishing: (i) saving, in a first set of latches, programming speed data which distinguishes the faster-programming non-volatile storage elements of the target word line from the slower-programming non-volatile storage elements of the target word line, (ii) continuing programming of at least some of the faster-programming non-volatile storage elements of the target word line, with a programming speed-based slow down measure imposed thereon, in response to the programming speed data in the first set of latches, and (iii) continuing programming of at least some of the slower-programming non-volatile storage elements of the target word line, without imposing a programming speed-based slow down measure;
subsequently, performing programming operations for non-volatile storage elements of another word line in the set of non-volatile storage elements; and
during the next phase: continuing programming of the faster-programming non-volatile storage elements of the target word line, with a programming speed-based slow down measure imposed, responsive to the programming speed data in the first set of latches, and continuing programming of the slower-programming non-volatile storage elements of the target word line, without imposing a programming speed-based slow down measure, responsive to the programming speed data in the first set of latches.

2. The method of claim 1, wherein the performing programming operations for the non-volatile storage elements of the another word line includes:
performing one phase of a multi-phase programming operation, including (c) distinguishing faster-programming non-volatile storage elements from slower-programming non-volatile storage elements, and (d) responsive to the distinguishing of the faster-programming non-volatile storage elements from the slower-programming non-volatile storage elements for the another word line: (i) saving, in a second set of latches, programming speed data which distinguishes the faster-programming non-volatile storage elements of the another word line from the slower-programming non-volatile storage elements of the another word line, (ii) continuing programming of at least some of the faster-programming non-volatile storage elements of the another word line, with a programming speed-based slow down measure imposed thereon, in response to the second set of latches, and (iii) continuing programming of at least some of the slower-programming non-volatile storage elements of the another word line, without imposing a programming speed-based slow down measure, in response to the second set of latches.

3. The method of claim 2, wherein:
the one phase involving the non-volatile storage elements of the target word line uses a first set of verify levels;
the one phase involving the non-volatile storage elements of the another word line uses the first set of verify levels; and
the next phase involving the non-volatile storage elements of the target word line uses a second set of verify levels, each verify level in the second set of verify levels is higher than a corresponding verify level in the first set of verify levels.

4. The method of claim 1, wherein:
each associated programming speed-based slow down measure comprises a raised bit line voltage.

5. The method for claim 1, wherein:
the performing the next phase includes imposing a programming speed-based slow down measure on each slower-programming non-volatile storage elements of the target word line, while imposing a further programming speed-based slow down measure on each faster-programming non-volatile storage element of the target word line.

6. The method for claim 1, further comprising:
resetting the first set of latches, responsive to completion of the next phase.

7. The method of claim 2, further comprising:
for the non-volatile storage elements of the another word line: performing a next phase of a multi-phase programming operation thereof, including continuing programming of the faster-programming non-volatile storage elements of the another word line, with a programming speed-based slow down measure imposed thereon, responsive to the second set of latches, and continuing programming of the slower-programming non-volatile storage elements of the another word line, without imposing a programming speed-based slow down measure, responsive to the second set of latches.

8. The method of claim 7, further comprising:
for non-volatile storage elements of an additional word line in the set of non-volatile storage elements: performing one phase of a multi-phase programming operation thereof, including (c) distinguishing faster-programming non-volatile storage elements of the additional word line from slower-programming non-volatile storage elements of the additional word line, and (d) responsive to the distinguishing the faster-programming non-volatile storage elements of the additional word line from the slower-programming non-volatile storage elements of the additional word line: (i) saving, in the first set of latches, programming speed data which distinguishes the faster-programming non-volatile storage elements of the additional word line from the slower-programming non-volatile storage elements of the additional word line, (ii) continuing programming of at least some of the faster-programming non-volatile storage elements of the additional word line, with a programming speed-based slow down measure imposed thereon, responsive to the programming speed data in the first set of latches, and (iii) continuing programming of at least some of the slower-programming non-volatile storage elements of the additional word line, without imposing a programming speed-based slow down measure, responsive to the programming speed data in the first set of latches.

9. The method of claim 1, wherein:
program pulses are applied to the target word line in the multi-phase programming operation; and
a step size of the program pulses is temporarily reduced during the distinguishing faster-programming non-volatile storage elements of the target word line from slower-programming non-volatile storage elements of the target word line.

10. The method of claim 1, wherein:
program pulses are applied to the target word line in the multi-phase programming operation; and
the method further includes reading the first set of latches before each remaining program pulse in the one phase after the distinguishing step (a), where the continuing programming of steps (ii) and (iii) are responsive to the reading.

11. A non-volatile storage apparatus, comprising:
a set of non-volatile storage elements comprising non-volatile storage elements of a target word line and non-volatile storage elements of another word line;
a first set of latches; and
one or more control circuits, the one or more control circuits, to perform a multi-phase programming operation which includes one phase and a next phase, for non-volatile storage elements of the target word line: perform the one phase, including distinguish faster-programming non-volatile storage elements of the target word line from slower-programming non-volatile storage elements of the target word line, and responsive to the distinguishing: save, in the first set of latches, programming speed data which distinguishes the faster-programming non-volatile storage elements of the target word line from the slower-programming non-volatile storage elements of the target word line, continue to program at least some of the faster-programming non-volatile storage elements of the target word line, with a programming speed-based slow down measure imposed thereon, in response to the programming speed data in the first set of latches, and continue to program at least some of the slower-programming non-volatile storage elements of the target word line, without imposition of a programming speed-based slow down measure; subsequently, perform programming operations for non-volatile storage elements of another word line in the set of non-volatile storage elements; and during the next phase: continue to program the faster-programming non-volatile storage elements of the target word line, with a programming speed-based slow down measure imposed, responsive to the programming speed data in the first set of latches, and continue to program the slower-programming non-volatile storage elements of the target word line, without imposition of a programming speed-based slow down measure, responsive to the programming speed data in the first set of latches.

12. The non-volatile storage apparatus of claim 11, further comprising:
a second set of latches;
wherein the one or more control circuits, to perform the programming operations for the non-volatile storage elements of the another word line: perform one phase of a multi-phase programming operation, including distinguish faster-programming non-volatile storage elements from slower-programming non-volatile storage elements, and responsive to the distinguishing of the faster-programming non-volatile storage elements from the slower-programming non-volatile storage elements for the another word line: save, in a second set of latches, programming speed data which distinguishes the faster-programming non-volatile storage elements of the another word line from the slower-programming non-volatile storage elements of the another word line, continue to program at least some of the faster-programming non-volatile storage elements of the another word line, with a programming speed-based slow down measure imposed thereon, in response to the second set of latches, and continue to program at least some of the slower-programming non-volatile storage elements of the another word line, without imposition of a programming speed-based slow down measure, in response to the second set of latches.

13. The non-volatile storage apparatus of claim 12, wherein:
the one phase involving the non-volatile storage elements of the target word line uses a first set of verify levels;
the one phase involving the non-volatile storage elements of the another word line uses the first set of verify levels; and
the next phase involving the non-volatile storage elements of the target word line uses a second set of verify levels, each verify level in the second set of verify levels is higher than a corresponding verify level in the first set of verify levels.

14. The non-volatile storage apparatus of claim 11, wherein:
each associated programming speed-based slow down measure comprises a raised bit line voltage.

15. The non-volatile storage apparatus for claim 11, wherein:
the one or more control circuits, to perform the next phase, impose a programming speed-based slow down measure on each slower-programming non-volatile storage elements of the target word line, and impose a further programming speed-based slow down measure on each faster-programming non-volatile storage element of the target word line.

16. The non-volatile storage apparatus for claim 11, wherein:
the one or more control circuits reset the first set of latches, responsive to completion of the next phase.

17. The non-volatile storage apparatus of claim 12, wherein:
for the non-volatile storage elements of the another word line, the one or more control circuits: to perform a next phase of a multi-phase programming operation thereof, including continue to program the faster-programming non-volatile storage elements of the another word line, with a programming speed-based slow down measure imposed thereon, responsive to the second set of latches, and continue to program the slower-programming non-volatile storage elements of the another word line, without an imposition of a programming speed-based slow down measure, responsive to the second set of latches.

18. The non-volatile storage apparatus of claim 17, wherein:
for non-volatile storage elements of an additional word line in the set of non-volatile storage elements, the one or more control circuits: perform one phase of a multi-phase programming operation thereof, including distinguish faster-programming non-volatile storage elements of the additional word line from slower-programming non-volatile storage elements of the additional word line, and responsive to the distinguishing the faster-programming non-volatile storage elements of the additional word line from the slower-programming non-volatile storage elements of the additional word line: save, in the first set of latches, programming speed data which distinguishes the faster-programming non-volatile storage elements of the additional word line from the slower-programming non-volatile storage elements of the additional word line, continue to program at least some of the faster-programming non-volatile storage elements of the additional word line, with a programming speed-based slow down measure imposed thereon, responsive to the programming speed data in the first set of latches, and continue to program at least some of the slower-programming non-volatile storage elements of the additional word line, without imposition of a programming speed-based slow down measure, responsive to the programming speed data in the first set of latches.

19. The non-volatile storage apparatus of claim 11, wherein:
the one or more control circuits apply program pulses to the target word line in the multi-phase programming operation, and temporarily reduce a step size of the program pulses when the faster-programming non-volatile storage elements of the target word line are distinguished from the slower-programming non-volatile storage elements of the target word line.

20. The non-volatile storage apparatus of claim 11, wherein:
the one or more control circuits apply program pulses to the target word line in the multi-phase programming operation, and read the first set of latches before each remaining program pulse in the one phase after the faster-programming non-volatile storage elements of the target word line are distinguished from the slower-programming non-volatile storage elements of the target word line.

* * * * *